(12) United States Patent
Lin et al.

(10) Patent No.: US 11,855,182 B2
(45) Date of Patent: \*Dec. 26, 2023

(54) LOW-K GATE SPACER AND METHODS FOR FORMING THE SAME

(71) Applicant: Taiwan Semiconductor Manufacturing Co., Ltd., Hsinchu (TW)

(72) Inventors: Wen-Kai Lin, Yilan (TW); Bo-Yu Lai, Taipei (TW); Li Chun Te, Renwu Township (TW); Kai-Hsuan Lee, Hsinchu (TW); Sai-Hooi Yeong, Zhubei (TW); Tien-I Bao, Taoyuan (TW); Wei-Ken Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 201 days.

This patent is subject to a terminal disclaimer.

(21) Appl. No.: 17/090,121

(22) Filed: Nov. 5, 2020

(65) Prior Publication Data

US 2021/0057546 A1  Feb. 25, 2021

Related U.S. Application Data

(63) Continuation of application No. 16/592,955, filed on Oct. 4, 2019, now Pat. No. 10,833,170, which is a (Continued)

(51) Int. Cl.
*H01L 29/66* (2006.01)
*H01L 27/092* (2006.01)
(Continued)

(52) U.S. Cl.
CPC .............. *H01L 29/66553* (2013.01); *H01L 21/823821* (2013.01); *H01L 21/823864* (2013.01);
(Continued)

(58) Field of Classification Search
CPC .......... H01L 29/66795; H01L 29/7851; H01L 29/4985; H01L 27/0924; H01L 21/82382
See application file for complete search history.

(56) References Cited

U.S. PATENT DOCUMENTS 9,093,425 B1 * 7/2015 Breil .................... H01L 21/2855
9,425,105 B1 * 8/2016 Basker ............. H01L 21/823821
(Continued)

FOREIGN PATENT DOCUMENTS

CN     106601737 A    4/2017
CN     107068757 A    8/2017
(Continued)

*Primary Examiner* — Jay C Chang
(74) *Attorney, Agent, or Firm* — Slater Matsil, LLP

(57) ABSTRACT

Embodiments of the present disclosure relate to a FinFET device having gate spacers with reduced capacitance and methods for forming the FinFET device. Particularly, the FinFET device according to the present disclosure includes gate spacers formed by two or more depositions. The gate spacers are formed by depositing first and second materials at different times of processing to reduce parasitic capacitance between gate structures and contacts introduced after epitaxy growth of source/drain regions.

20 Claims, 28 Drawing Sheets

Related U.S. Application Data continuation of application No. 15/812,966, filed on Nov. 14, 2017, now Pat. No. 10,490,650.

(51) Int. Cl.
  *H01L 21/8238* (2006.01)
  *H01L 29/08* (2006.01)
  *H01L 29/78* (2006.01)

(52) U.S. Cl.
  CPC ...... *H01L 27/0924* (2013.01); *H01L 29/0847* (2013.01); *H01L 29/66545* (2013.01); *H01L 29/66636* (2013.01); *H01L 29/66795* (2013.01); *H01L 29/7851* (2013.01); *H01L 21/823814* (2013.01)

(56) References Cited

U.S. PATENT DOCUMENTS

| | | | |
|---|---|---|---|
| 9,449,884 | B1 | 9/2016 | Seo |
| 9,620,644 | B2 * | 4/2017 | Basker ............... H01L 21/2022 |
| 9,768,278 | B1 | 9/2017 | Chui et al. |
| 9,806,155 | B1 * | 10/2017 | Basker ............ H01L 21/823431 |
| 10,074,668 | B2 | 9/2018 | Ching et al. |
| 10,262,894 | B2 | 4/2019 | Hsieh et al. |
| 10,833,170 | B2 * | 11/2020 | Lin .................... H01L 29/66636 |
| 2011/0227232 | A1 * | 9/2011 | Bonilla ............... H01L 23/5283 257/E21.585 |
| 2015/0035061 | A1 | 2/2015 | Yoon et al. |
| 2015/0318282 | A1 | 11/2015 | Rodder et al. |
| 2015/0280305 | A1 | 12/2015 | Basker et al. |
| 2015/0380514 | A1 | 12/2015 | Bentley et al. |
| 2016/0093741 | A1 | 3/2016 | Yang et al. |
| 2016/0111420 | A1 | 4/2016 | Zhang et al. |
| 2016/0111540 | A1 | 4/2016 | Zhang et al. |
| 2016/0315081 | A1 | 10/2016 | Park et al. |
| 2016/0336428 | A1 * | 11/2016 | Cheng .................... H01L 29/167 |
| 2017/0084714 | A1 | 3/2017 | Ching et al. |
| 2017/0092645 | A1 * | 3/2017 | Cai ................. H01L 21/823828 |
| 2017/0110476 | A1 | 4/2017 | Ching et al. |
| 2017/0154990 | A1 | 6/2017 | Sung et al. |
| 2017/0221757 | A1 | 8/2017 | Hsieh et al. |
| 2017/0221906 | A1 | 8/2017 | Lin et al. |
| 2017/0315044 | A1 * | 11/2017 | Krishnan .................. G03F 7/00 |
| 2017/0365462 | A1 * | 12/2017 | Varadarajan ............ C23C 16/50 |
| 2018/0006138 | A1 * | 1/2018 | Cheng ................. H01L 21/3086 |
| 2018/0033871 | A1 * | 2/2018 | Xie .................... H01L 21/02532 |
| 2018/0108769 | A1 * | 4/2018 | Cheng ................ H01L 29/6656 |
| 2018/0212029 | A1 | 7/2018 | Xu et al. |

FOREIGN PATENT DOCUMENTS

| | | |
|---|---|---|
| CN | 107104147 A | 8/2017 |
| TW | 201715732 A | 5/2017 |
| TW | 201735772 A | 10/2017 |
| TW | 201737339 A | 10/2017 |

* cited by examiner

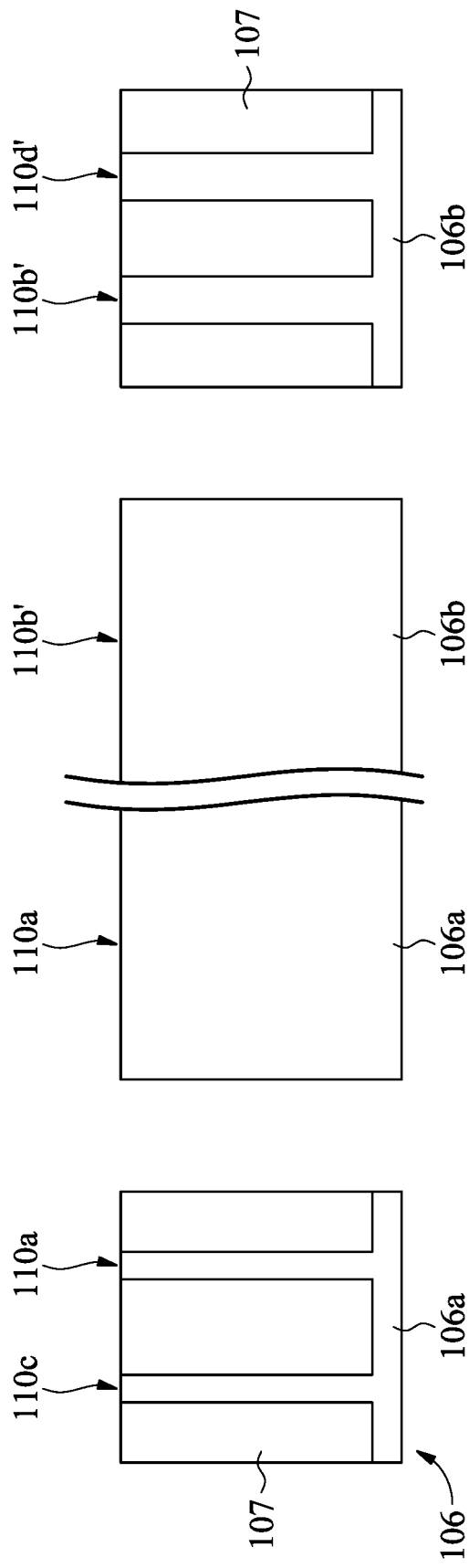

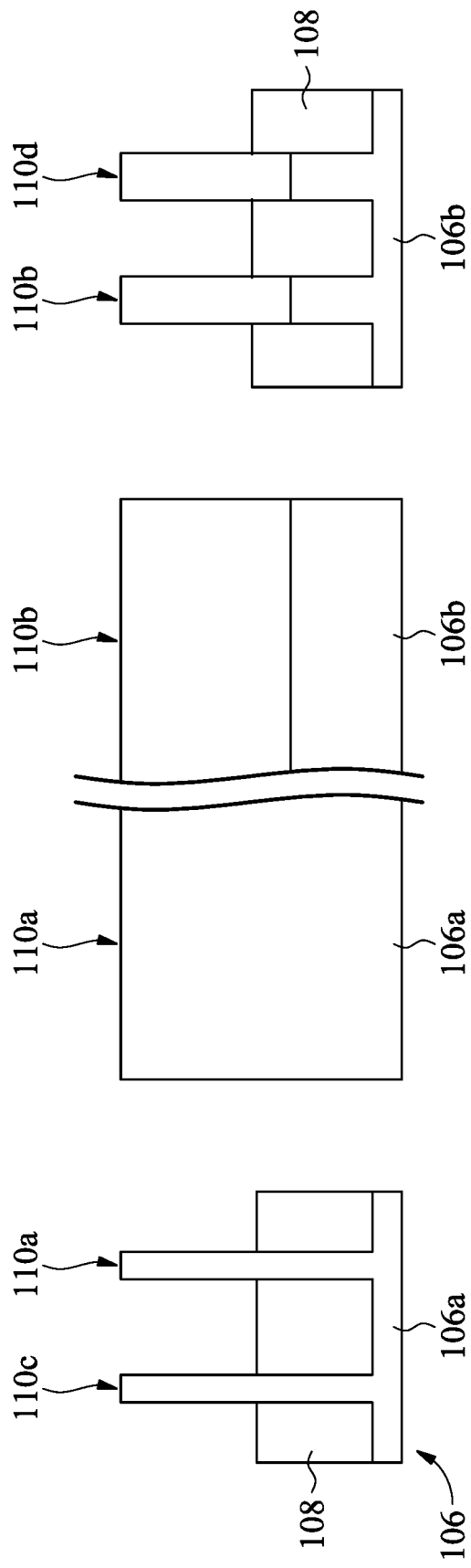

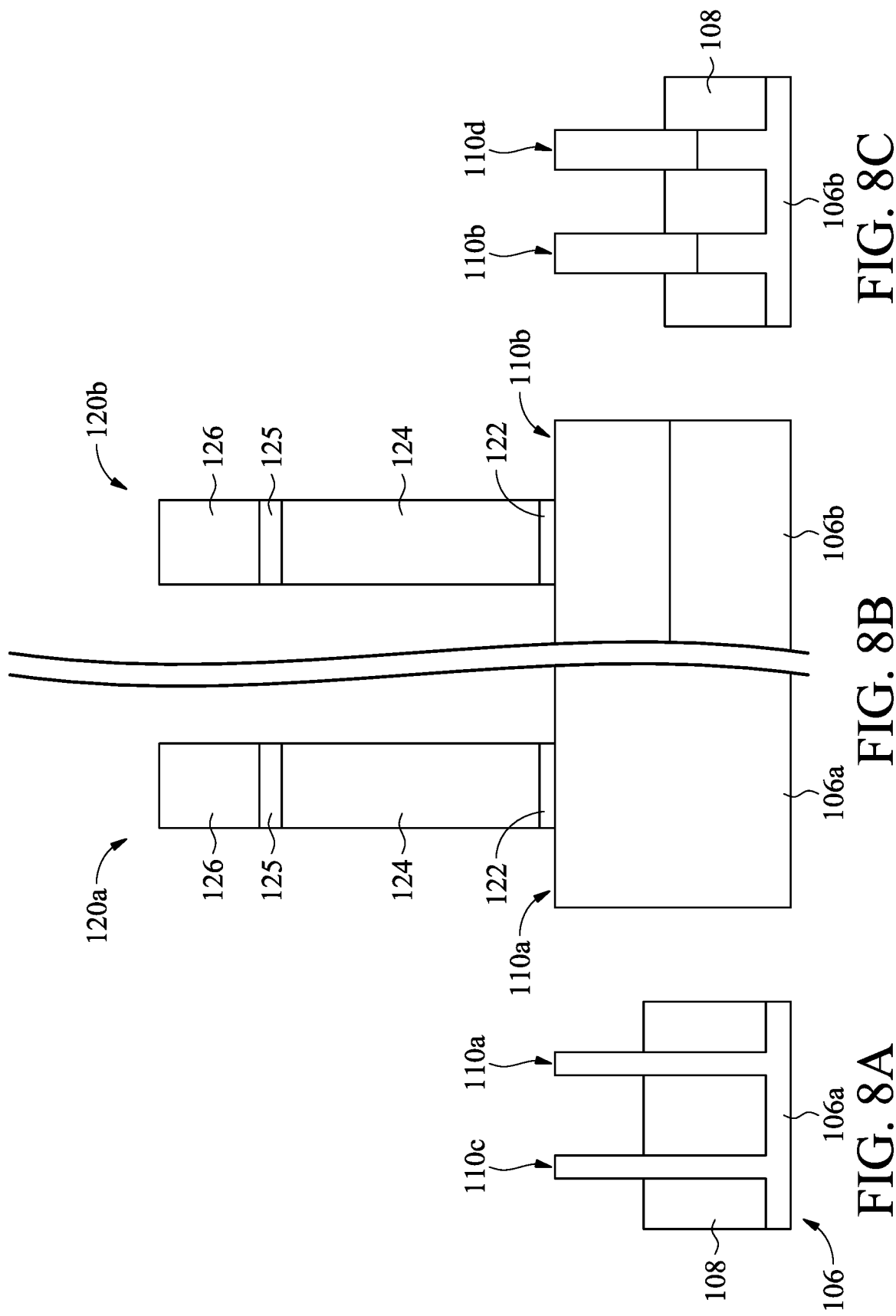

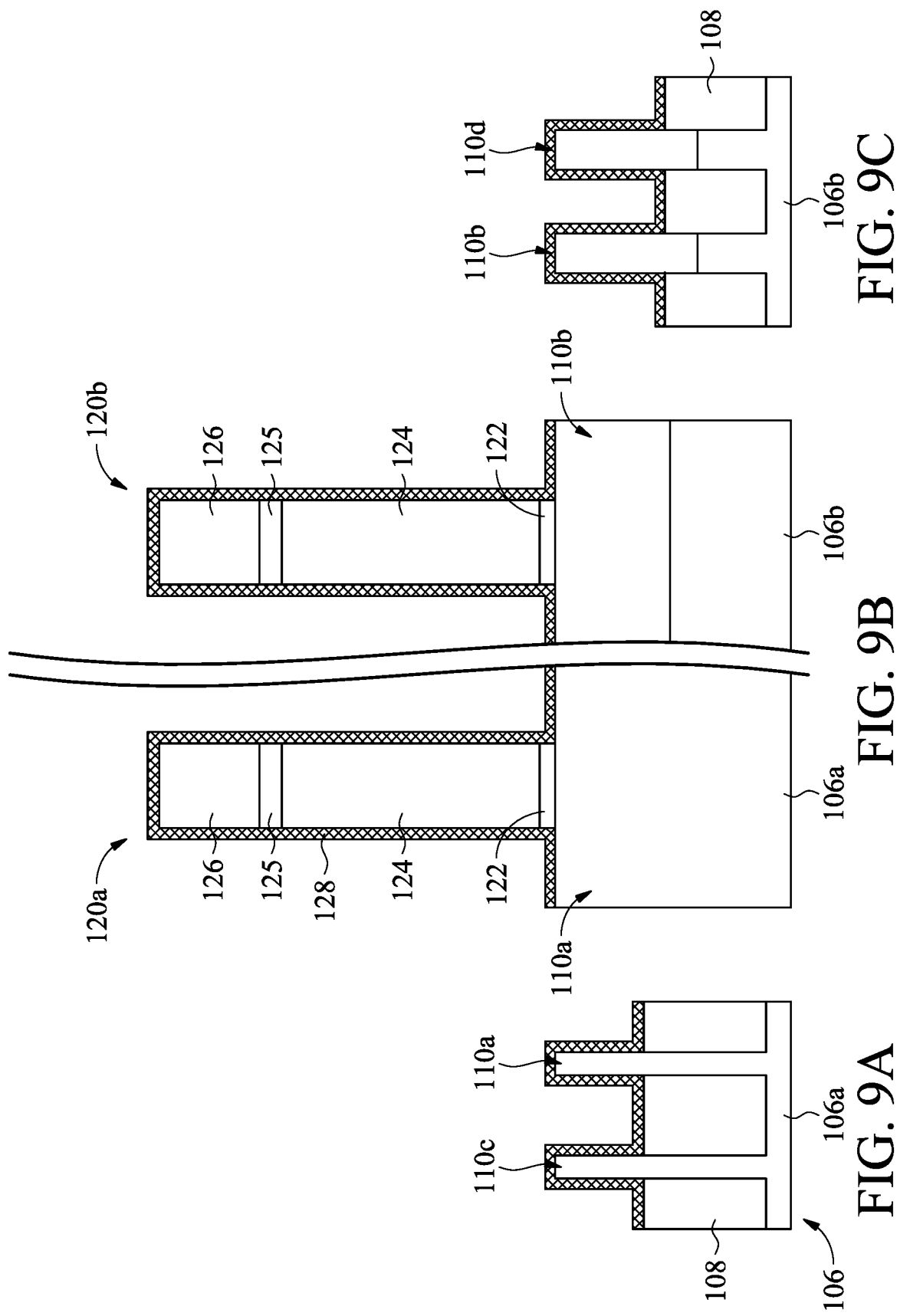

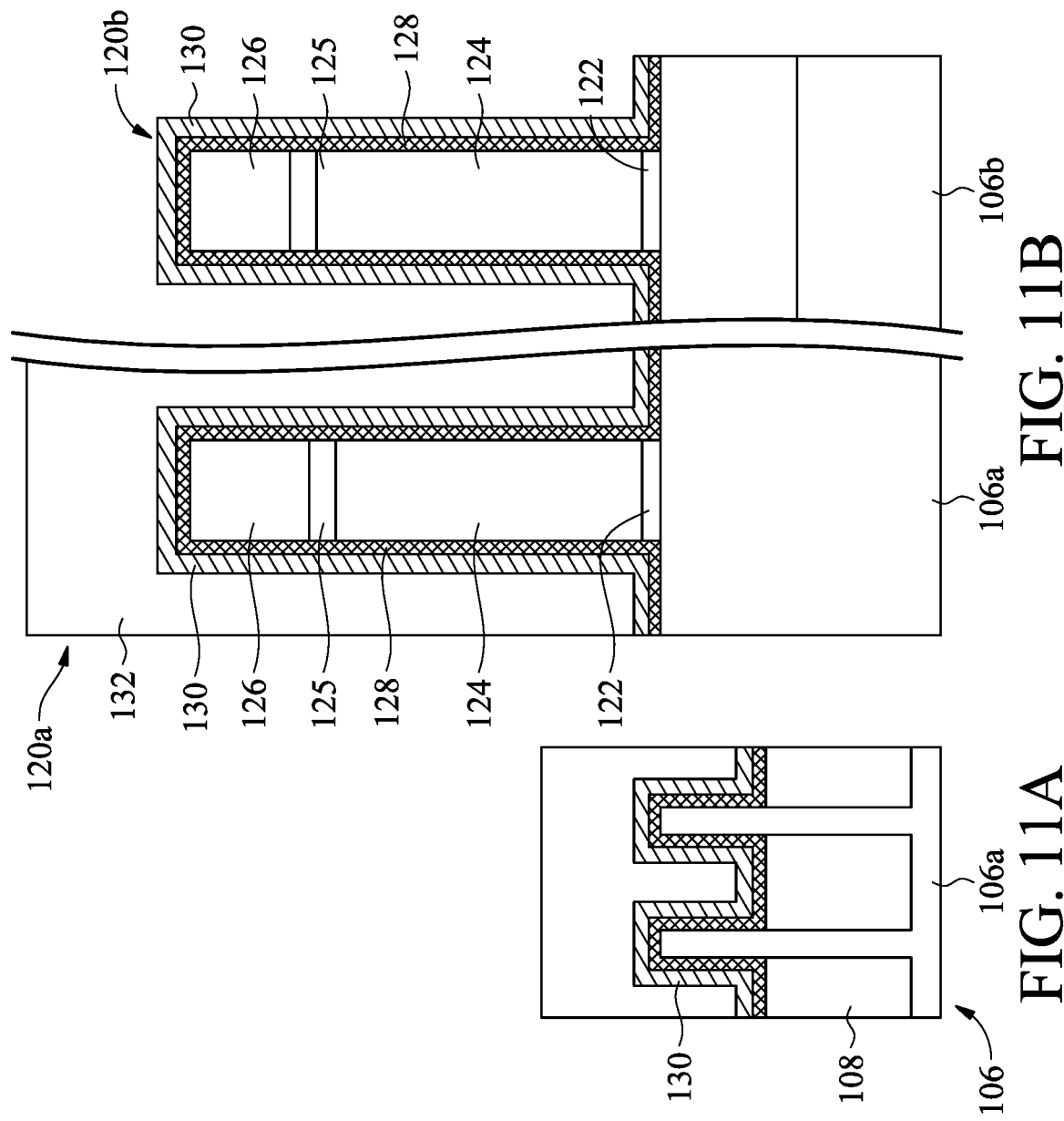

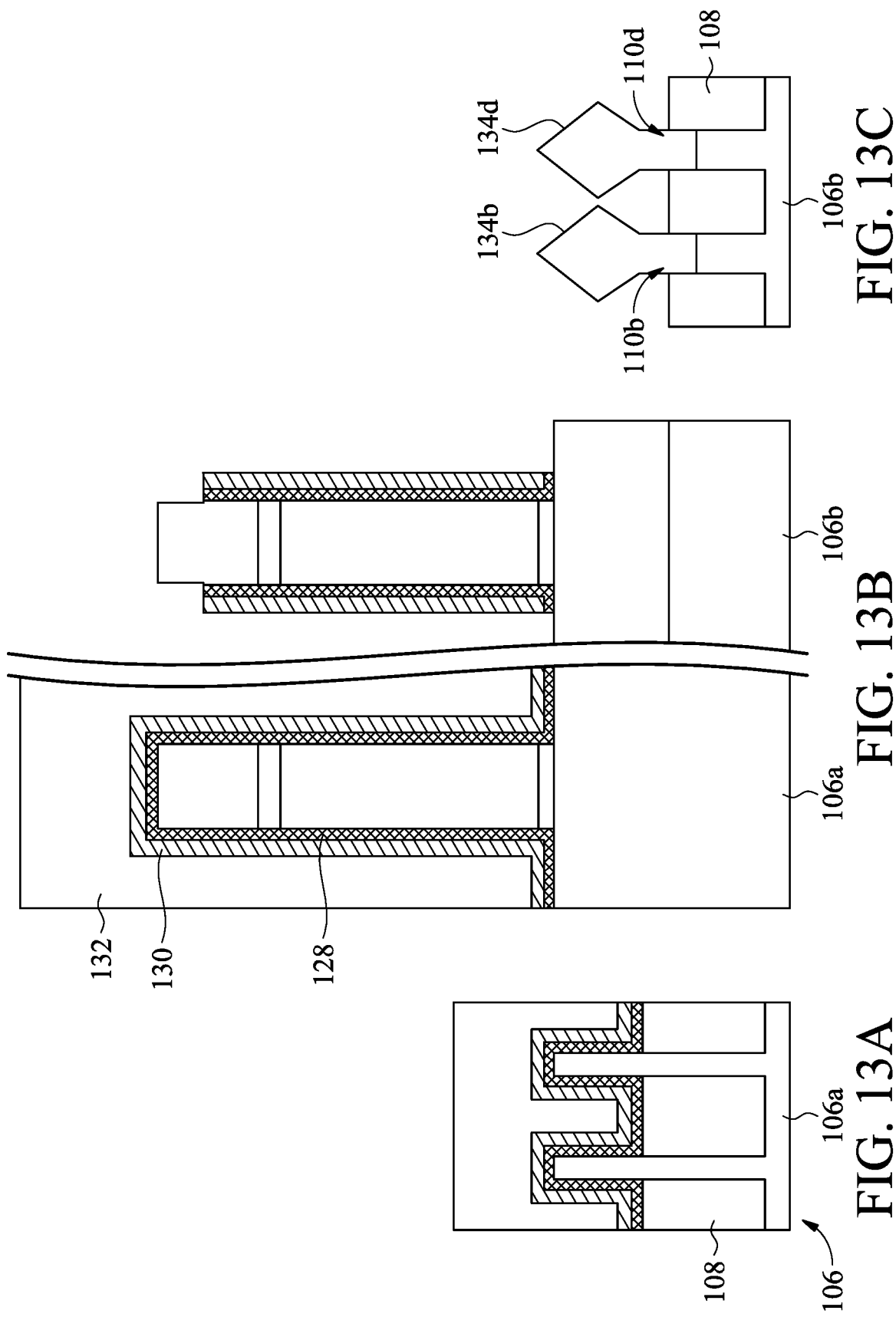

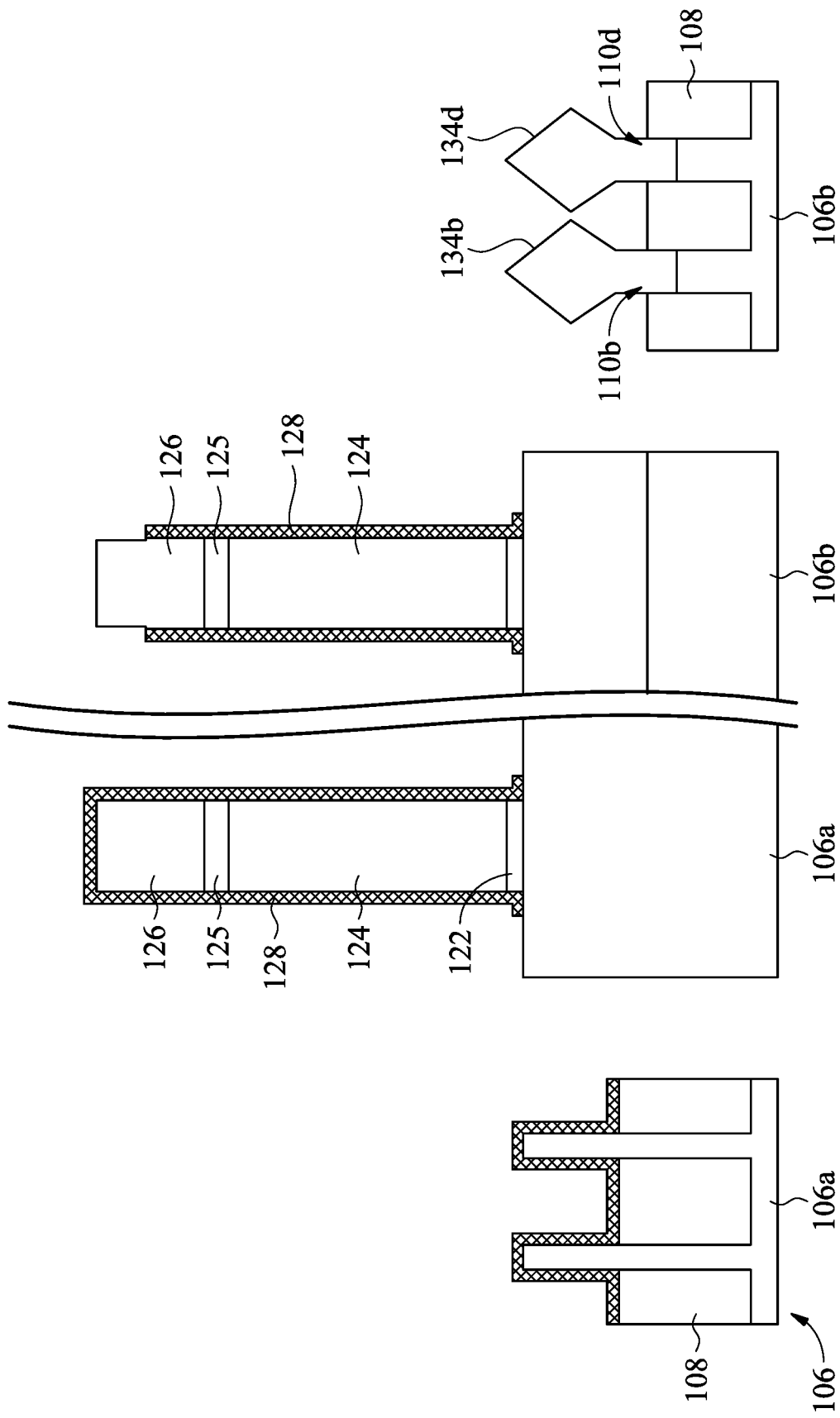

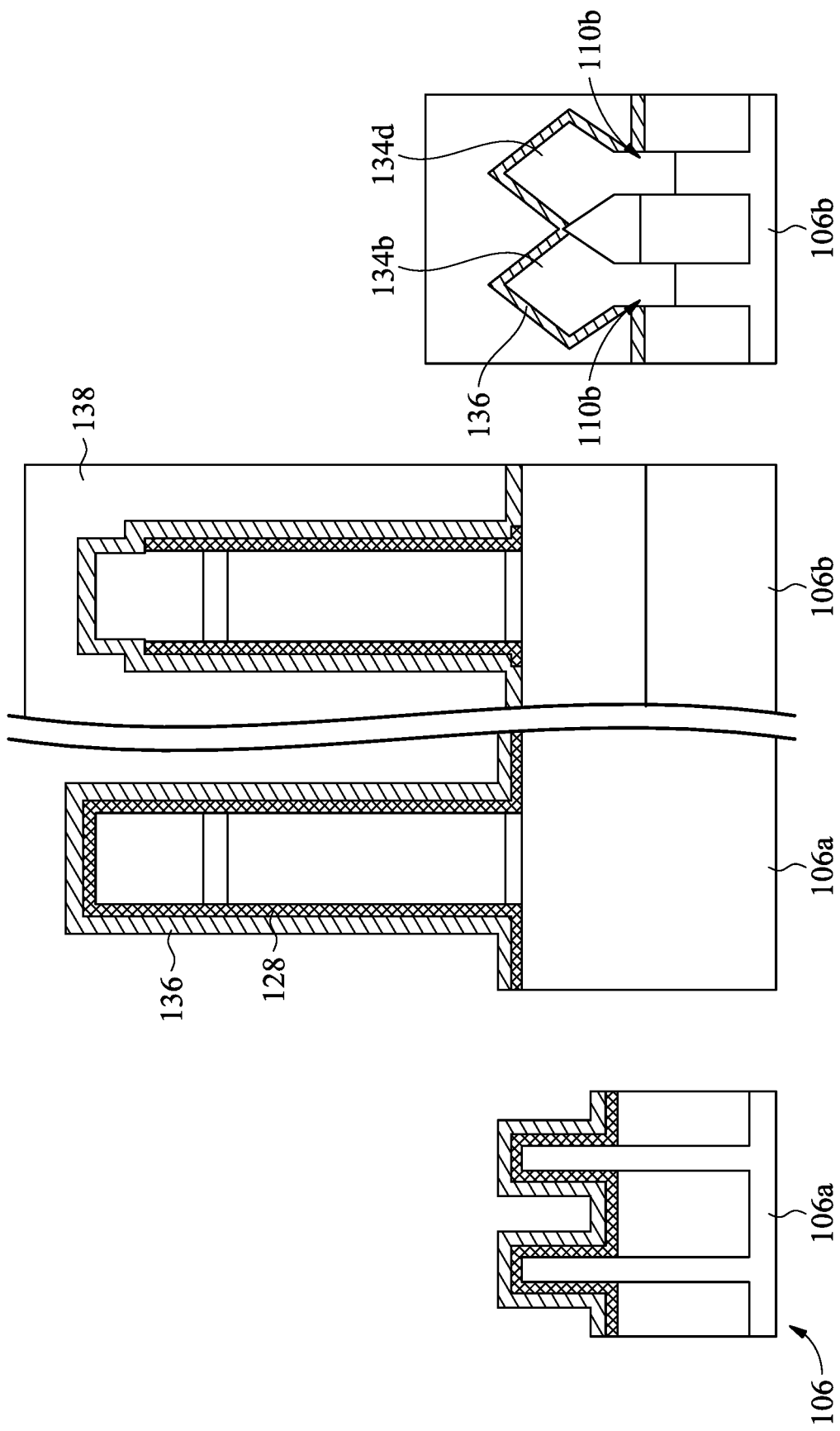

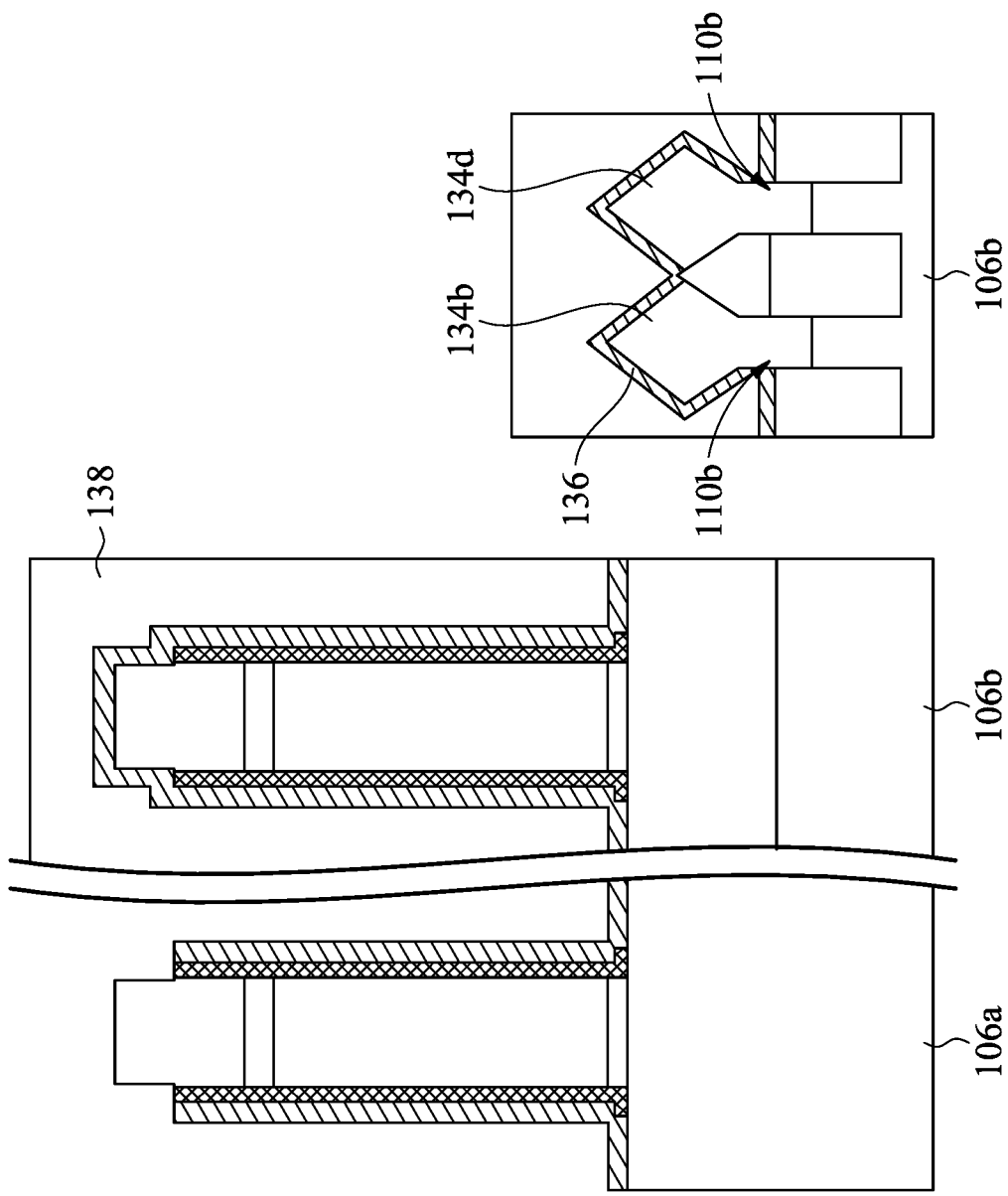
FIG. 18C
FIG. 18B
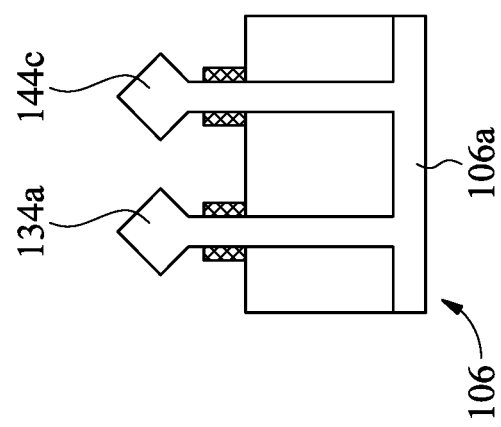
FIG. 18A

LOW-K GATE SPACER AND METHODS FOR FORMING THE SAME

PRIORITY CLAIM AND CROSS-REFERENCE

This application is a continuation of U.S. patent application Ser. No. 16/592,955, filed on Oct. 4, 2019, which is a continuation of U.S. patent application Ser. No. 15/812,966, filed on Nov. 14, 2017, now U.S. Pat. No. 10,490,650 issued Nov. 26, 2019, each is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a fin like field-effect transistor (FinFET) is scaled down through various technology nodes, several strategies have been employed to improve device performance, such as using epitaxy channels to enhance carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The patent or application file contains at least one drawing executed in color. Copies of this patent or patent application publication with color drawing(s) will be provided by the Office upon request and payment of the necessary fee.

FIGS. 2A-C, 3A-C, 4A-C, 5A-C, 6A-C, 7A-C, 8A-C, 9A-C, 10A-C, 11A-C, 12A-C, 13A-C, 14A-C, 15A-C, 16A-C, 17A-C, 18A-C, 19A-C, 20A-C, 21A-C, 22A-C, 23A-C, 24A-C, 25A-C, 26A-C, 27A-C, and 28A-C are cross-sectional views of respective intermediate structures during intermediate stages in an example process of forming a gate structure with gate spacers in FinFET devices in accordance with some embodiments.

DETAILED DESCRIPTION

Figure 1:
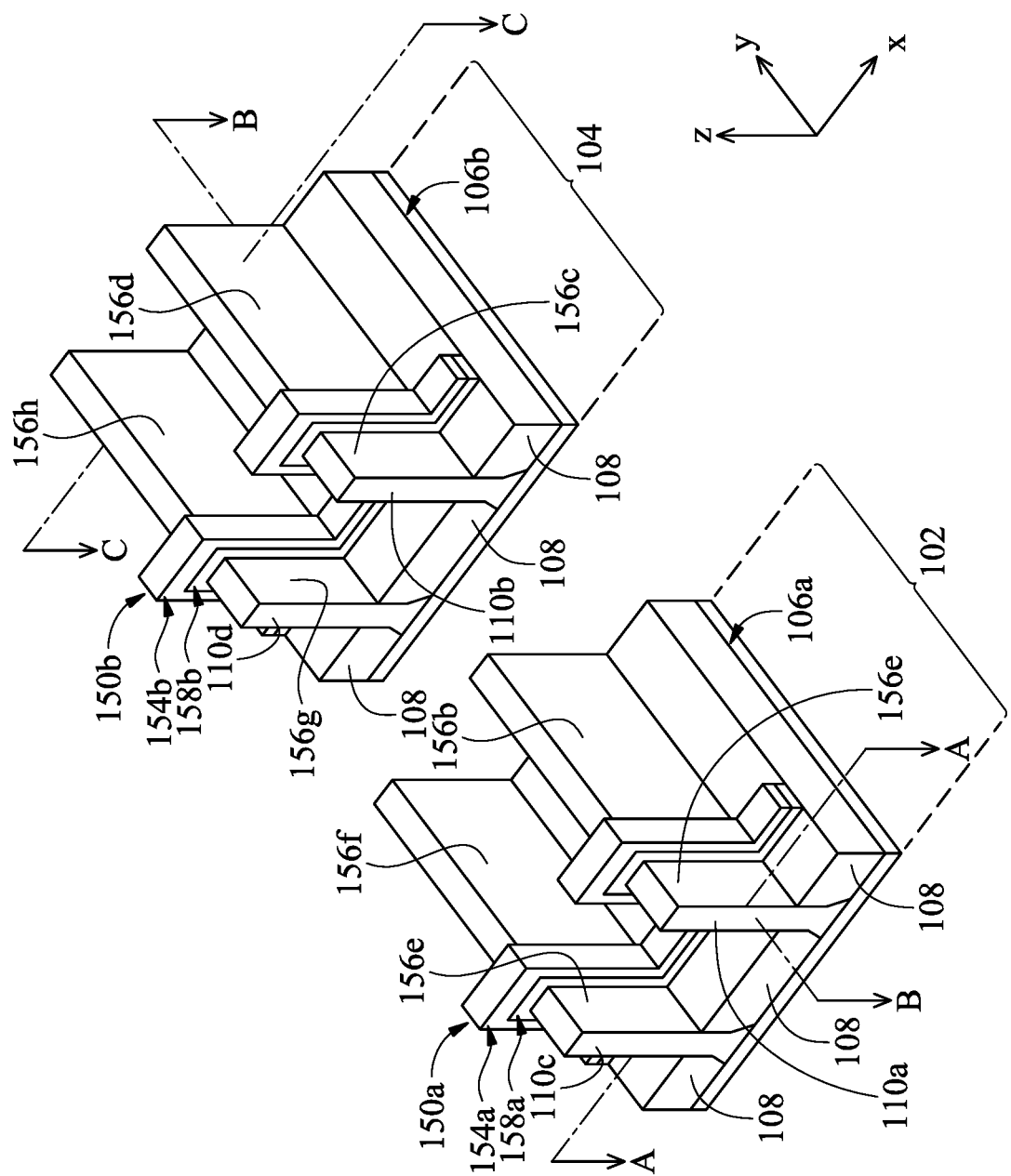
FIG. 1 is an example of simplified Fin Field Effect Transistor (FinFET) devices in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to a FinFET device having gate spacers with reduced capacitance and methods for forming the FinFET device. Particularly, the FinFET device according to the present disclosure includes gate spacers formed by two or more depositions. The gate spacers are formed by depositing first and second materials at different times of processing to reduce parasitic capacitance between gate structures and contacts introduced after epitaxy growth of source/drain regions.

FIG. 1 schematically illustrates a device 100 in a three-dimensional view. Other aspects not illustrated in or described with respect to FIG. 1 may become apparent from the following figures and description. The device 100 may be part of an IC, such as a microprocessor, memory cell, such as static random-access memory (SRAM), and/or other integrated circuits. The device 100 may be electrically connected or coupled in a manner to operate as, for example, two transistors or more, such as four transistors.

The device 100 may include an N-type FinFET structure 102 and a P-type FinFET structure 104. The N-type FinFET structure 102 includes fins 110a and 110c on a P-doped region 106a. The N-type FinFET structure 102 includes isolation regions 108, and the fins 110a and 110c each protrude above and from between neighboring isolation regions 108. Gate stack 150a is along sidewalls and over top surfaces of the fins 110a and 110c. The gate stack 150a includes gate dielectric 158a and gate electrode 154a over the gate dielectric 158a. Source/drain regions 156 a-b and 156c-f are disposed in respective regions of the fins 110a and 110c. Source/drain regions 156a and 156b are disposed in opposing regions of the fin 111a with respect to the gate dielectric 158a and gate electrode 154a. Source/drain regions 156e and 156f are disposed in opposing regions of the fin 110c with respect to the gate dielectric 158a and gate electrode 154a.

In some examples, two transistors may be implemented in the N-type FinFET structure 102 by: (1) source/drain regions 156a and 156b and the gate stack 150a; and (2) source/drain regions 156e and 156f and the gate stack 150a. Some source/drain regions may be shared between various transistors, for example. In some examples, various ones of the source/drain regions may be connected or coupled together such that the N-type FinFET structure 102 is implemented as one functional transistor. For example, if neighboring (e.g., as opposed to opposing) source/drain regions 156a, 156e and 156b, 156f are electrically connected, respectively, such as through coalescing the regions by epitaxial growth (e.g., source/drain regions 156a and 156e being coalesced, and source/drain regions 156b and 156f being coalesced), one functional transistor may be implemented. Other configurations in other examples may implement other numbers of functional transistors.

The P-type FinFET structure 104 includes fins 110b and 110d on an N-doped region 106b. The P-type FinFET structure 104 includes isolation regions 108, and the fins 110b and 110d each protrude above and from between neighboring isolation regions 108. Gate stack 150b is along sidewalls and over top surfaces of the fins 110b and 110d. The gate stack 150b includes gate dielectric 158b and gate electrode 154b over the gate dielectric 158b. Source/drain regions 156c-d and 156g-h are disposed in respective regions of the fins 110b and 110d. Source/drain regions 156c and 156d are disposed in opposing regions of the fin 110b with respect to the gate dielectric 158b and gate electrode 154b. Source/drain regions 156g and 156h are disposed in opposing regions of the fin 110d with respect to the gate dielectric 158b and gate electrode 154b.

In some examples, two transistors may be implemented in the P-type FinFET structure 104 by: (1) source/drain regions 156c and 156d and the gate stack 150b; and (2) source/drain regions 156g and 156h and the gate stack 150b. Some source/drain regions may be shared between various transistors, for example. In some examples, various ones of the source/drain regions may be connected or coupled together such that the P-type FinFET structure 104 is implemented as one functional transistor. For example, if neighboring (e.g., as opposed to opposing) source/drain regions 156c, 156g and 156d, 156h are electrically connected, respectively, such as through coalescing the regions by epitaxial growth (e.g., source/drain regions 156c and 156g being coalesced, and source/drain regions 156d and 156h being coalesced), one functional transistor may be implemented. Other configurations in other examples may implement other numbers of functional transistors.

FIG. 1 further illustrates reference cross-sections that are used in later figures. Cross-section B-B is in a vertical plane along channels in the fins 111a, 110b between opposing source/drain regions 156a-d. Cross-section A-A is in a vertical plane perpendicular to cross-section B-B and is across the source/drain region 156a in the fin 111a and across the source/drain region 156e in the fin 110c. Cross-section C-C is in a vertical plane perpendicular to cross-section B-B and is across the source/drain region 156d in the fin 110b and across the source/drain region 156h in the fin 110d. Subsequent figures refer to these reference cross-sections for clarity.

FIGS. 2A-C through 28A-C are cross-sectional views of respective intermediate structures during intermediate stages in an example process of forming a gate structure with gate spacers in, e.g., one or more FinFETs, in accordance with some embodiments. In FIGS. 2A-C through 28A-C, figures ending with an "A" designation illustrate cross-sectional views along a cross-section similar to cross-section A-A in FIG. 1; figures ending with a "B" designation illustrate cross-sectional views along a cross-section similar to cross-section B-B in FIG. 1; and figures ending with a "C" designation illustrate cross-sectional views along a cross-section similar to cross-section C-C in FIG. 1. In some figures, some reference numbers of components or features illustrated therein may be omitted to avoid obscuring other components or features; this is for ease of depicting the figures.

Figure 2C:
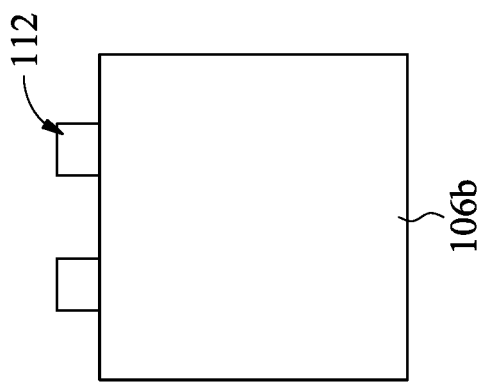
Figure 2B:
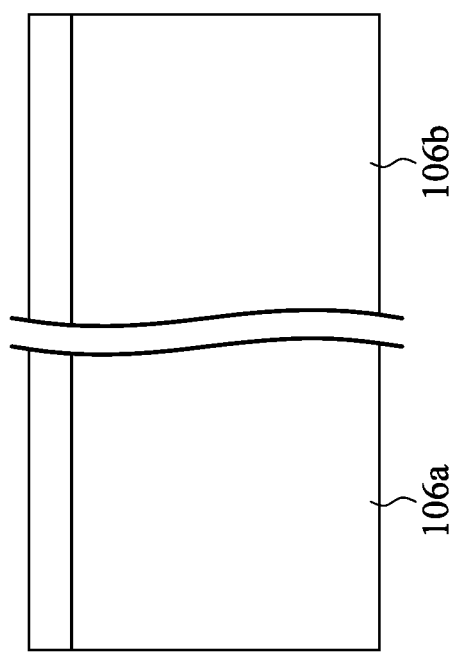
Figure 2A:
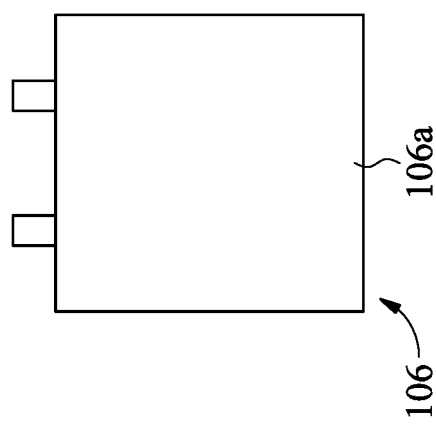

FIGS. 2A, 2B, and 2C illustrate a semiconductor substrate 106 having a fin mask 112 formed thereon for forming fins. The semiconductor substrate 106 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

The semiconductor substrate 106 includes the P-doped region 106a and N-doped region 106b for forming N-type FinFET and P-type FinFET respectively. One or both of the P-doped region 106a and N-doped region 106b may be a doped well formed by implantation into the semiconductor substrate 106. For example, the semiconductor substrate 106 can be a P-type doped substrate, a part of which forms the P-doped region 106a, and the N-doped region 106b may be an N-doped well formed by implanting N-type dopants into the P-type doped substrate.

The fin mask 112 may be a hard mask used to form the fins 111a-110d. For example, one or more mask layers are deposited over the semiconductor substrate 106 in the P-doped region 106a and the N-doped region 106b and then patterned into the fin mask 112. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photoresist may then be transferred to the one or more mask layers, such as by using a suitable etch process, which forms the fin mask. The etch process may include a reactive ion etch (RIE), neutral beam etch (NBE), the like, or a combination thereof. The etching may be anisotropic. Subsequently, the photo resist is removed in an ashing process or wet strip process.

Figure 3C:
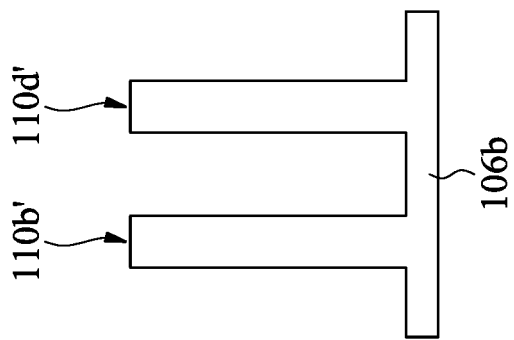
Figure 3B:
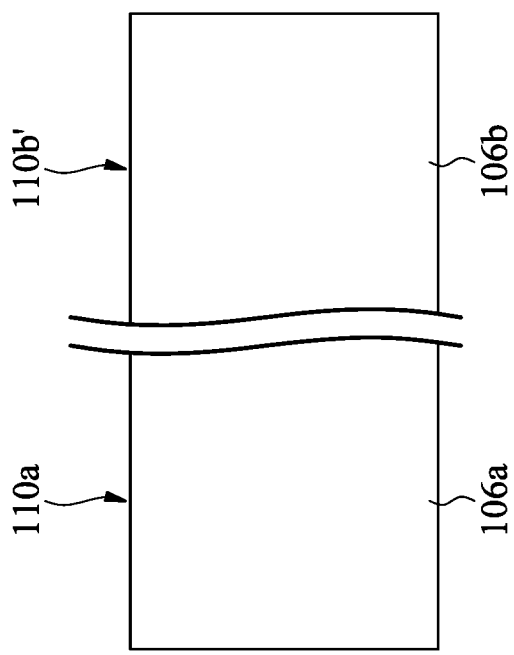
Figure 3A:
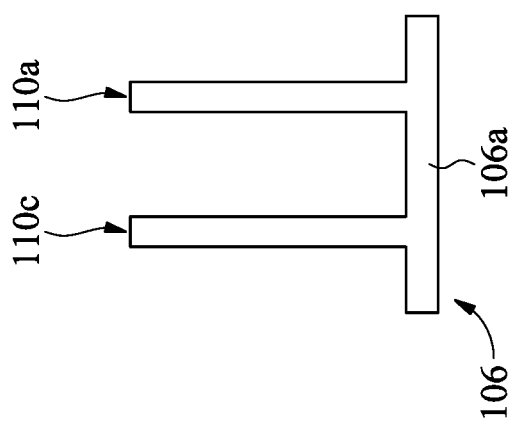

FIGS. 3A, 3B, and 3C illustrate that the semiconductor substrate 106 in the P-doped region 106a and the N-doped region 106b is etched to form fins 110a, 110c, 110b', 110d' such that the fins 110a, 110c, 110b', 110d' protrude from the P-doped region 106a and the N-doped region 106b. The etch process may include a RIE, NBE, the like, or a combination thereof. The etching may be anisotropic.

As shown in FIGS. 4A, 4B, and 4C, after formation of the fins 111a, 110b', 110c, 110d', an insulating material 107 may be deposited in the trenches between the fins 111a, 110b', 110c, 110d'. The insulating material 107 may be an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the insulating material 107 includes silicon oxide that is formed by a FCVD process. A planarization process, such as a chemical mechanical polish (CMP), may remove any excess insulating material and any remaining fin mask to form top surfaces of the insulating material and top surfaces of the fins 111a, 110b', 110c, 110d' to be coplanar.

Figure 5C:
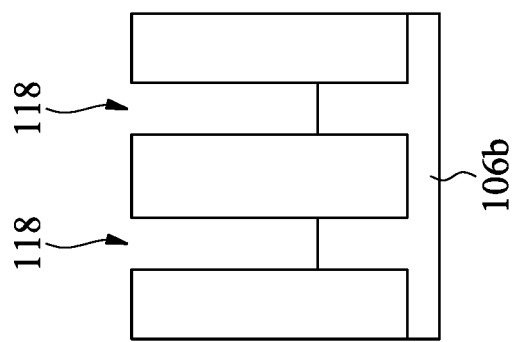
Figure 5B:
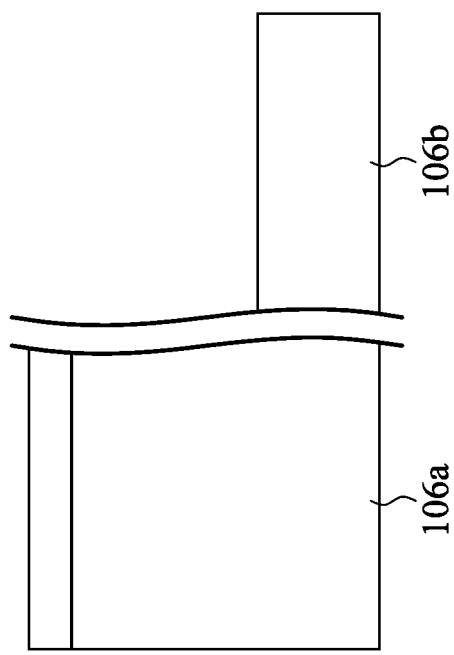
Figure 5A:
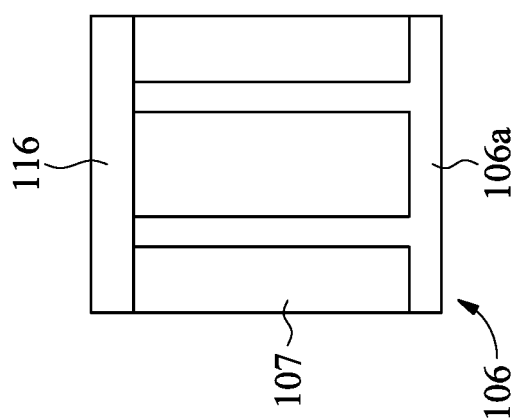

As shown in FIGS. 5A, 5B, and 5C, the fins 110b', 110d' may be etched back after planarization of the insulating material 107. For example, a mask 116 may be used to cover the P-doped region 106a so that the fins 110b', 110d' in the N-doped region 106b may be etched forming recesses 118 in the insulating material 107.

Figure 6C:
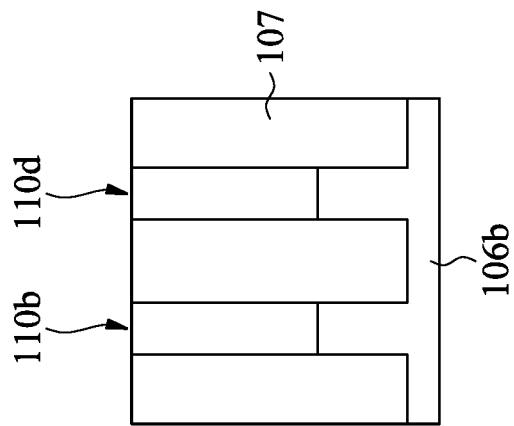
Figure 6B:
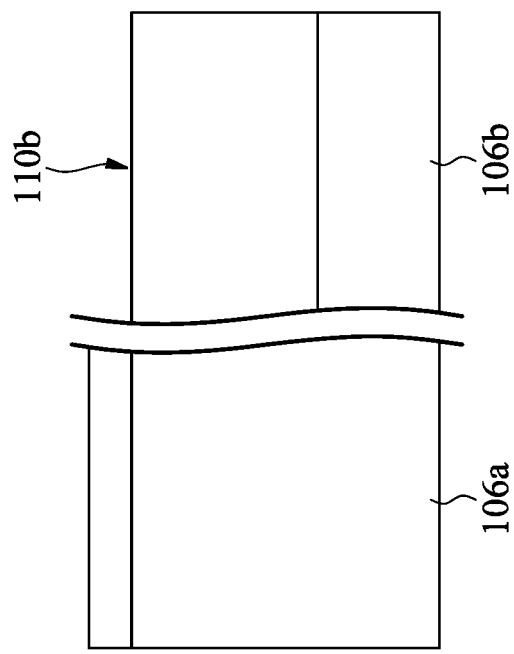
Figure 6A:
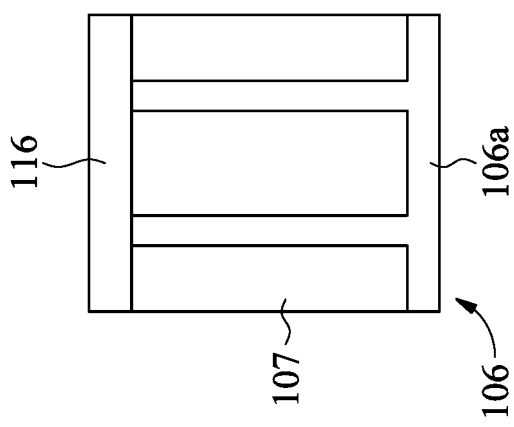

In FIGS. 6A, 6B, and 6C, replacement fins 110b, 110d are formed in the recesses 118 in the N-doped region 106b by epitaxial growth. In some embodiments, the fins 110b, 110d may comprise silicon, silicon germanium ($Si_xGe_{1-x}$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. In one embodiment, the replacement fins 110b, 110d include silicon germanium to provide improved mobility for P-type FinFET.

In FIGS. 7A, 7B, and 7C, the insulating material 107 is recessed to form the isolation regions 108. The insulating material 107 is recessed such that the fins 111a, 110b, 110c, 110d protrude from between neighboring isolation regions 108, which may, at least in part, thereby delineate the fins 111a, 110b, 110c, 110d as active areas in the P-doped region 106a and N-doped region 106b. The insulating material 107 may be recessed using an acceptable etching process, such as one that is selective to the material of the insulating material. For example, a chemical oxide removal using a CERTAS® etch or an Applied Materials SICONI® tool or dilute hydrofluoric (dHF) acid may be used. Further, top surfaces of the isolation regions 108 may have a flat surface as illustrated, a convex surface, a concave surface (such as dishing), or a combination thereof, which may result from an etch process.

As shown in FIGS. 8A, 8B, and 8C after formation of the isolation regions 108, dummy gate stacks 120a, 120b are then formed on the fins 111a, 110b, 110c, 110d. Each dummy gate stack 120a, 120b includes an interfacial dielectric 122, a dummy gate 124, an etch stop layer 125, and a hard mask 126. The interfacial dielectric 122, dummy gate 124, etch stop layer 125, and hard mask 126 may be formed by sequentially depositing respective layers and patterning those layers. For example, a layer for the interfacial dielectric 122 may include or be silicon oxide, silicon nitride, the like, or multilayers thereof, and may be thermally grown or deposited, such as by plasma-enhanced CVD (PECVD), ALD, or another deposition technique. A layer for the dummy gate 124 may include or be silicon (e.g., polysilicon) or another material deposited by CVD, PVD, or another deposition technique. A layer for the hard mask 126 may include or be silicon nitride, silicon oxynitride, silicon carbon nitride, the like, or a combination thereof, deposited by CVD, PVD, ALD, or another deposition technique. The layers for the hard mask 126, etch stop layer 125, dummy gate 124, and interfacial dielectric 122 may then be patterned, for example, using photolithography and one or more etch processes forming the dummy gate stacks 120a, 120b.

In FIGS. 9A, 9B, and 9C, a first spacer layer 128 is formed conformally over the substrate 106. The first spacer layer 128 covers the top surfaces and sidewalls of dummy gate stacks 120a, 120b, the top surface of isolation regions 108, and the sidewalls and the top surfaces of the fins 111a, 110b, 110c, 110d. In some embodiments, the first spacer layer 128 is made of silicon nitride (SiN), silicon oxycarbide (SiOC), silicon oxycarbonnitride (SiOCN), or other applicable dielectric materials. In some embodiments, the first spacer layer 128 includes one or more low-k dielectric materials having a dielectric constant (k) less than 3.9. In one example, the first spacer layer 128 may have a dielectric constant (k) in a range from about 3.9 to about 3.0. The first spacer layer 128 may be formed by plasma enhanced CVD, low pressure CVD, ALD, or other applicable processes.

In some embodiments, the thickness of the first spacer layer 128 is in a range from about 10 angstroms to about 30 angstroms. In some embodiments, the thickness of the first spacer layer 128 is in a range from about 40% to about 60% of a designed thickness of gate spacers.

Figure 10C:
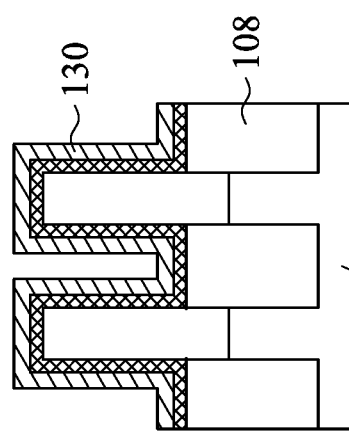
Figure 10B:
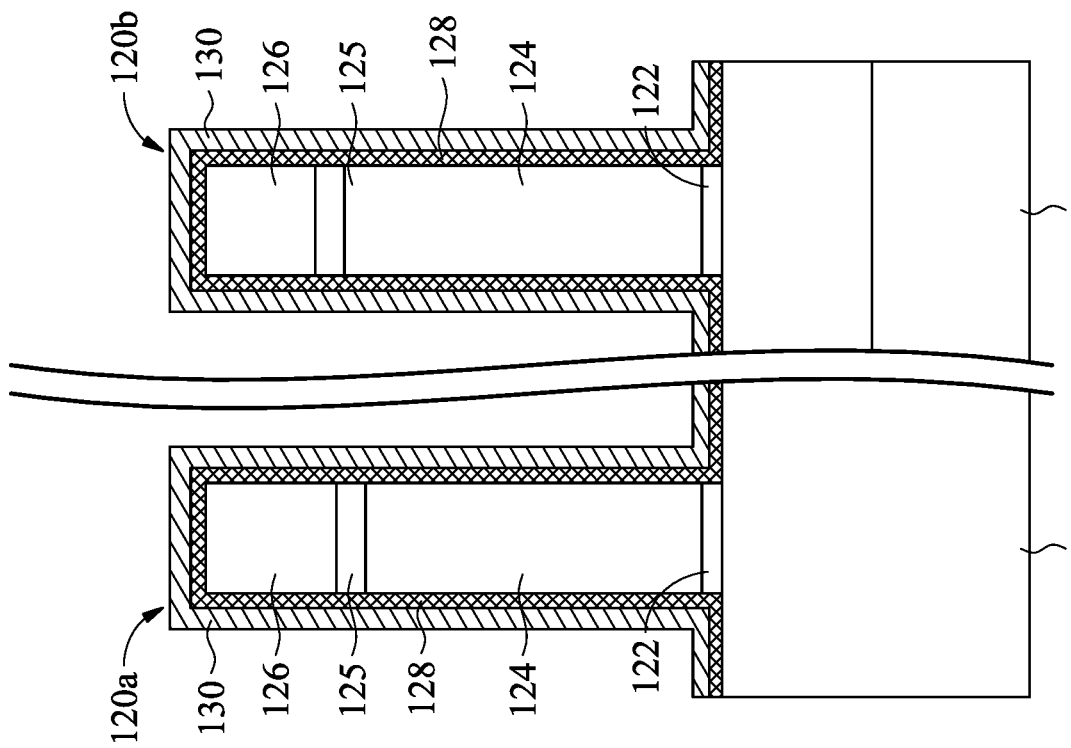
Figure 10A:
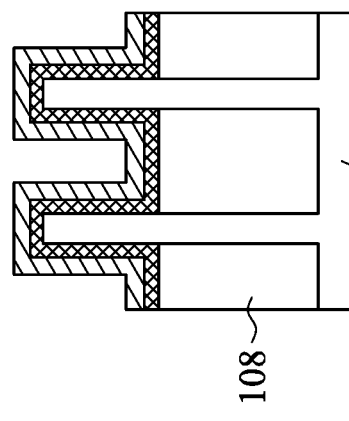

After the first spacer layer 128 is formed, a sacrificial layer 130 is formed over the first spacer layer 128 as shown in FIGS. 10A, 10B, and 10C. The sacrificial layer 130 is configured to protect the first spacer layer 128 from being damaged during subsequent processes, such as during an epitaxial process to form epitaxial source/drain regions. The sacrificial layer 130 may be a dielectric material that can stand process conditions of an epitaxial deposition process and can be selectively etched away from the first spacer layer 128. For example, the sacrificial layer 130 may include one of silicon nitride, silicon carbide nitride, silicon oxide, silicon oxynitride, or the like. In one embodiment, the sacrificial layer 130 includes silicon nitride. The sacrificial layer 130 may be formed by plasma enhanced CVD, low pressure CVD, ALD, or other applicable processes. The sacrificial layer 130 may have a thickness in a range from about 40 angstroms to about 60 angstroms.

In FIGS. 11A, 11B, and 11C, a hard mask 132 is formed over the P-doped region 106a to cover the N-type FinFET structure 102 while exposing the P-type FinFET structure 104 in the N-doped region 106b. The hard mask 132 may be formed through a photolithography process. In one embodiment, the hard mask 132 may be silicon nitride or the like.

Figures 12A, 12B, 12C:
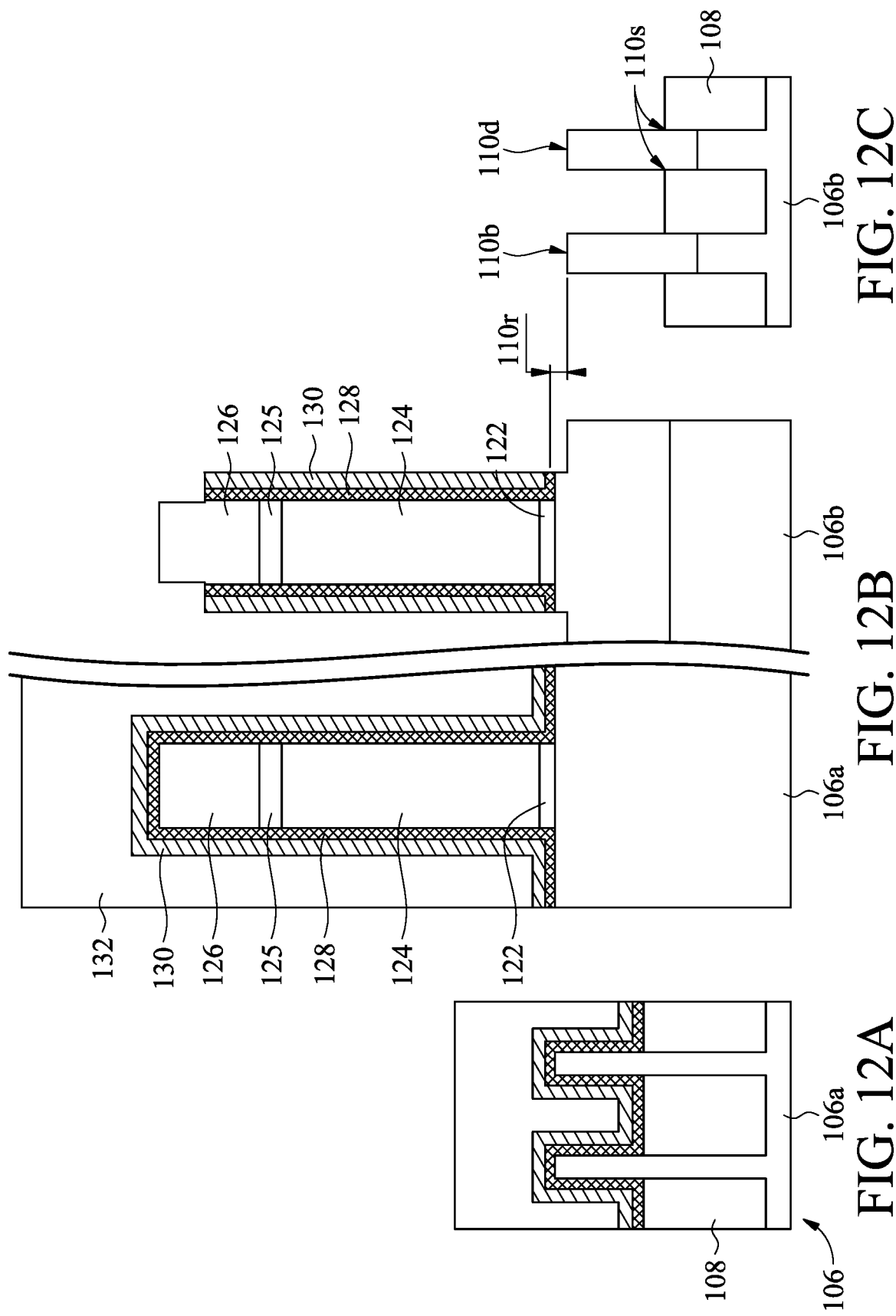

In FIGS. 12A, 12B, and 12C, an etch process is performed to expose the fins 110b, 110d in the P-type FinFET structure 104 to form source/drain regions therefrom. The etch process is an anisotropic etch process where the sacrificial layer 130 and the first spacer layer 128 are etched along the z-direction while remaining substantially unchanged along the x-direction and the y-direction (as shown in the coordinate system in FIG. 1). The anisotropic etch process may be performed by a RIE, NBE, or other suitable etch process.

As shown in FIG. 12B, the first spacer layer 128 and the sacrificial layer 130 remain on the sidewalls of the dummy gate stack 120b from up to a middle section of the hard mask 126. In one embodiment, the fins 110b, 110d are recessed by a recess amount 110r. The recess amount 110r may be in a range from about 0 nm to about 10 nm. The remaining fins 110b, 110d above the isolation region 108 are used to be a core for the subsequent epitaxial process.

The sacrificial layer 130 protects the first spacer layer 128 from losing thickness during the etch process to expose the fins 110b, 110d. With the first spacer layer 128 remaining over sidewalls of the dummy gate 124, the dummy gate 124 may not suffer any side wall loss or damage during the etch process. With the protection to the first spacer layer 128 at the sidewalls of the dummy gate stack 120b, the etch process may be performed to completely remove the first spacer layer 128 from a bottom portion of sidewalls 110s of the fins 110b, 110d, thus, preventing poor epitaxial growth caused by the remaining first spacer layer 128 during subsequent epitaxial process and preventing any corner damage caused by the remaining first spacer layer 128 on the sidewalls 110s of the fins 110b, 110d. The sacrificial layer 130 is over the hard mask 126 before the etch process and therefore is not exposed to the etch process during at least a portion of the duration of the etch process, thus, allowing the dummy gate 124 to remain being covered the hard mask 126. With the dummy gate 124 being covered with no undesired exposure, any undesirable epitaxial growth from the dummy gate 124, also known as mushroom defects, may be prevented from occurring during the subsequent epitaxial process. Additionally, the sacrificial layer 130 may also prevent some loss of the isolation regions 108 during the etch process.

In FIGS. 13A, 13B, and 13C, an epitaxial process is performed to grow epitaxial structures 134b, 134d from the fins 110b, 110d. The epitaxial structures 134b, 134d are formed to function as source/drain regions for P-type Fin-FET devices. The epitaxial structures 134b, 134d may include a single-element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In an embodiment, the epitaxial structures 134b, 134d include an epitaxially grown silicon germanium (SiGe) to function as source/drain regions for P-type FinFET devices.

The epitaxial structures 134b, 134d are formed by a suitable epitaxial process, for example, a selective epitaxial growth (SEG) process, a chemical vapor deposition (CVD) process (e.g., vapor-phase epitaxy (VPE), a low pressure chemical vapor deposition (LPCVD), and/or ultra-high vacuum CVD (UHV-CVD)), molecular beam epitaxy (MBE), liquid phase epitaxy (LPE), or combinations thereof. The formation process of the epitaxial structures 134b, 134d may use gaseous and/or liquid precursors, which may interact with the composition of the fins 110b, 110d thereunder.

The epitaxial structures 134b, 134d may be doped or undoped in-situ during the epitaxial process. For example, the epitaxially grown SiGe epitaxial structure may be doped with boron. The doping may be achieved by an ion implantation process, plasma immersion ion implantation (PIII) process, gas and/or solid source diffusion process, another suitable process or combinations thereof. The epitaxial structures 134b, 134d may further be exposed to an annealing process, such as a rapid thermal annealing (RTA) and/or laser annealing process. The annealing process may be used to activate the dopants. If the epitaxial structures 134b, 134d are not doped in-situ, a second implantation process (e.g., a junction implant process) is performed to dope the epitaxial structures 134b, 134d.

The epitaxial structures 134b, 134d are strained and stressed to enhance carrier mobility of the FinFET device structure and enhance the FinFET device structure performance. The performance of the P-type FinFET structure 104 may be relative to the volume of the epitaxial structures 134b, 134d. For example, if the volume of the epitaxial structures 134b, 134d is increased, the operation speed of the P-type FinFET structure 104 is also increased. In FIG. 13C, the cross sectional shape of each epitaxial structures 134b, 134d is substantially a rhombus shape as a result that silicon germanium is formed more efficiently along its crystal planes. However, the shape of the epitaxial structures 134b, 134d is not intended to be limiting.

In FIGS. 14A, 14B, and 14C, the hard mask 132 and the sacrificial layer 130 are removed by an etch process. In one embodiment, the hard mask 132 and the sacrificial layer 130 may be removed by a wet etching process. For example, the hard mask 132 and the sacrificial layer 130 are removed using a wet etchant comprising $H_3PO_4$. Other suitable etchants, such as HF or the like may also be used.

Figure 15A:
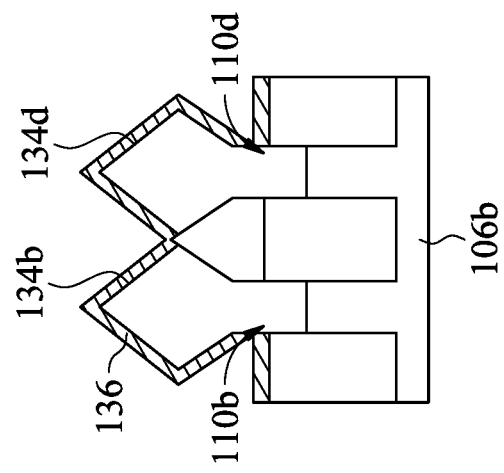
Figure 15B:
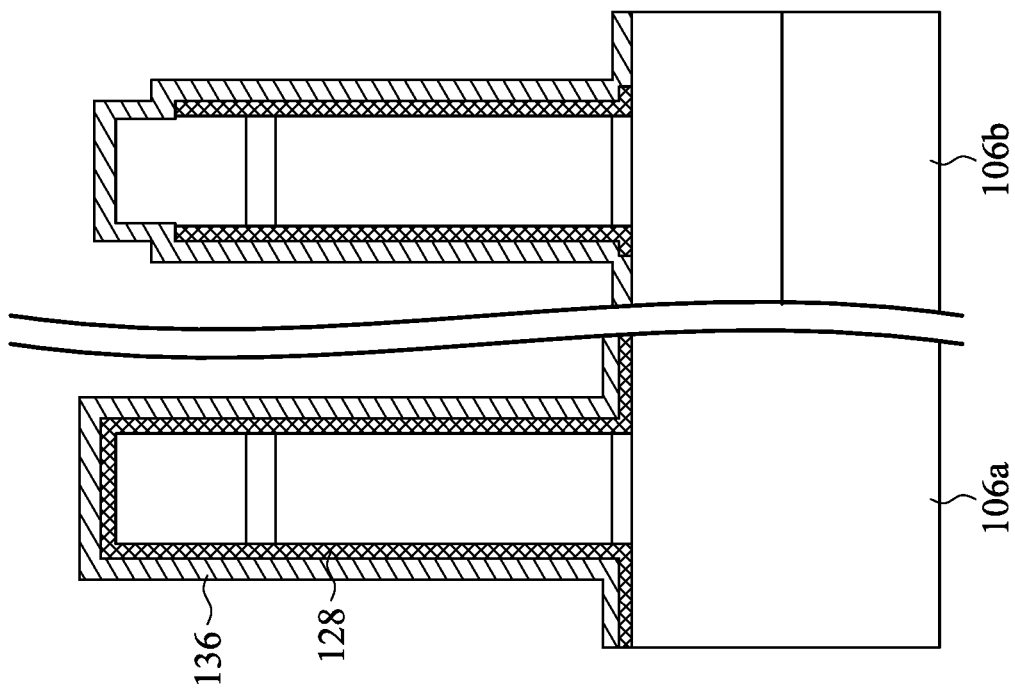
Figure 15C:
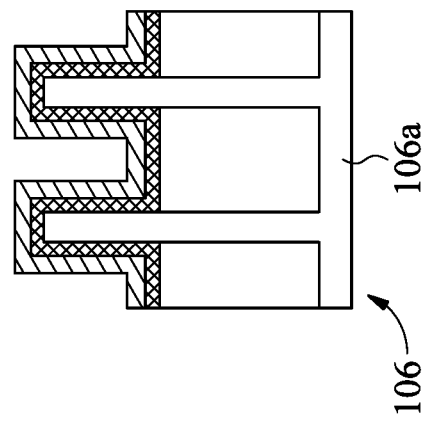

As shown in FIGS. 15A, 15B, and 15C, after the hard mask 132 and the sacrificial layer 130 are removed, a sacrificial layer 136 may be formed over the substrate 106 over both the P-doped region 106a and the N-doped region 106b. The sacrificial layer 136 is configured to protect the first spacer layer 128 during the subsequent fin recess process and epitaxial process in the P-doped region 106a. The sacrificial layer 136 is similar to the sacrificial layer 130. The sacrificial layer 136 may be a dielectric material that can stand process conditions of an epitaxial deposition process and can be selectively etched away from the first spacer layer 128. For example, the sacrificial layer 136 may include one of silicon nitride, silicon carbide nitride, silicon oxide, silicon oxynitride, or the like. In one embodiment, the sacrificial layer 136 includes silicon nitride. The sacrificial layer 136 may be formed by plasma enhanced CVD, low pressure CVD, ALD, or other applicable processes. The sacrificial layer 136 may have a thickness in a range from about 40 angstroms to about 60 angstroms.

In FIGS. 16A, 16B, and 16C, a hard mask 138 is formed over the N-doped region 106b to cover the P-type FinFET structure 104 while exposing the N-type FinFET structure 102 in the P-doped region 106a. The hard mask 138 may be formed through a photolithography process. In one embodiment, the hard mask 138 may be silicon nitride or the like.

Figures 17A, 17B, 17C:
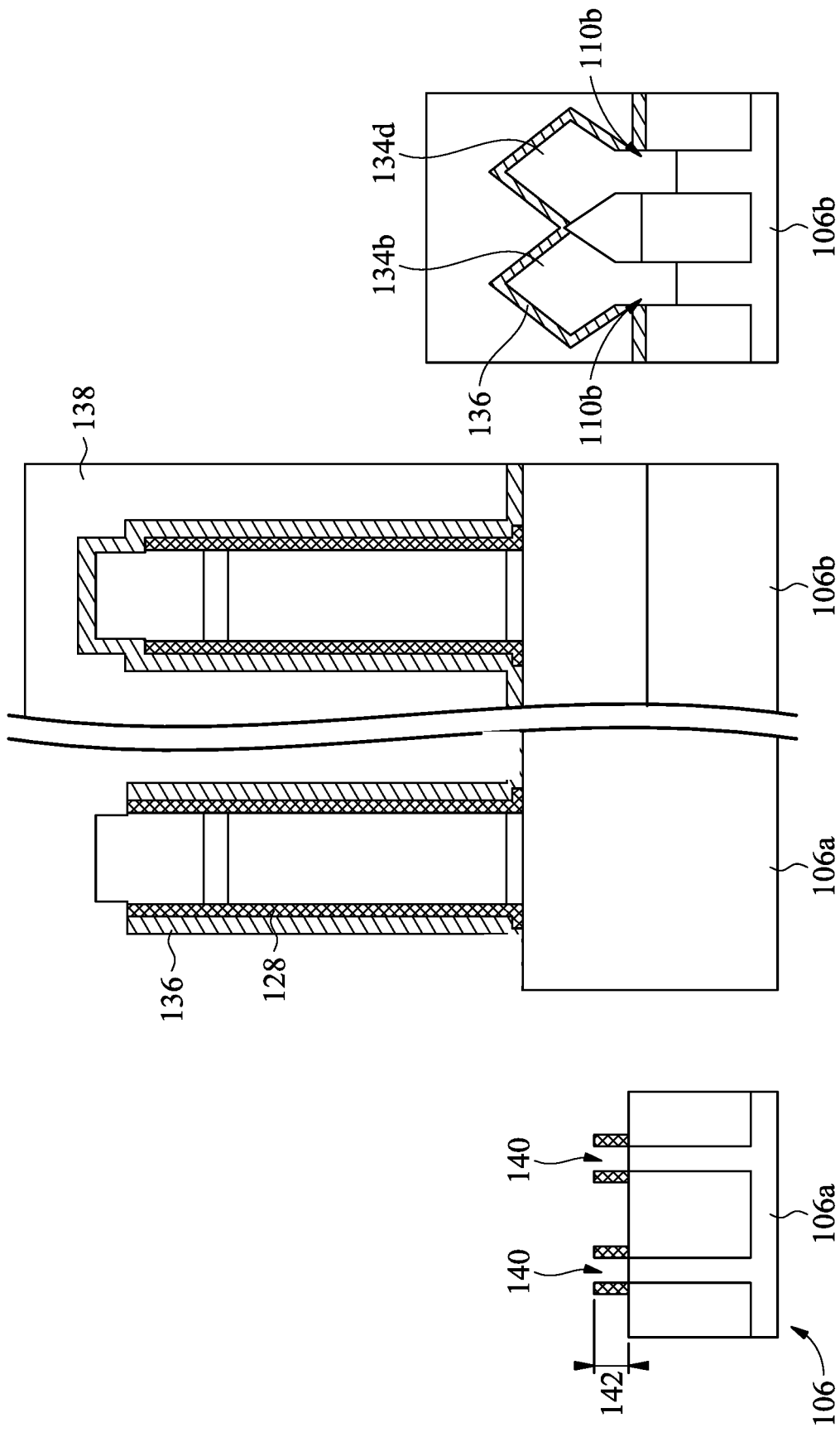

In FIGS. 17A, 17B, and 17C, an etch process is performed to recess the fins 111a, 110c in the N-type FinFET structure 102 so that epitaxial source/drain regions can be formed. The etch process is an anisotropic etch process where the sacrificial layer 136 and the first spacer layer 128 are etched along the z-direction while remaining substantially unchanged along the x-direction and the y-direction. The anisotropic etch process may be performed by a RIE, NBE, or other suitable etch process.

As shown in FIG. 17B, the first spacer layer 128 and the sacrificial layer 136 remain on the sidewalls of the dummy gate stack 120a from up to a middle section of the hard mask 126. As shown in FIG. 17A, after the etch process, a spacer portion 128r of the first spacer layer 128 remains over a top surface 108s of the isolation regions 108. A height 142 of the spacer portion 128r may be in a range from about 0 nm to about 10 nm. Recesses 140 are formed between the spacer portions 128r. The recesses 140 may be used to limit horizontal growth during the initial stage of growing epitaxial source/drain regions.

The sacrificial layer 136 protects the first spacer layer 128 from losing thickness during recessing the fins 111a, 110c. With the first spacer layer 128 remaining over sidewalls of the dummy gate 124, the dummy gate 124 in the dummy gate stack 120a may not suffer any side wall loss or damage during the etch process. With the protection to the first spacer layer 128 at the sidewalls of the dummy gate stack 120a, the etch process may be performed to control the height 142 of the spacer portion 128r, thus, achieving suitable height 142 to the dimension of the epitaxial source/drain regions to be grown in the subsequent epitaxial process. With suitable height of the spacer portion 128r, merging or coalescing of epitaxial source/drain regions between neighboring fins are prevented, thus, improving CD control. The sacrificial layer 136 is over the hard mask 126 before the etch process and therefore is not exposed to the etch process during at least a portion of the duration of the etch process, thus, allowing the dummy gate 124 to remain being covered the hard mask 126. With the dummy gate 124 being covered with no undesired exposure, any undesirable epitaxial growth from the dummy gate 124, also known as mushroom defects, may be prevented from occurring during the subsequent epitaxial process. Additionally, the sacrificial layer 136 may also prevent loss of the isolation regions 108 during the etch process.

In FIGS. 18A, 18B, and 18C, an epitaxial process is performed to grow epitaxial structures 134a, 134c from the fins 111a, 110c in the recesses 140. The epitaxial structures 134a, 134c are formed to function as source/drain regions for N-type FinFET devices. The epitaxial structures 134a, 134c may be silicon including N-type dopants, such as phosphorus, carbon, or combinations thereof.

The epitaxial structures 134a, 134c are formed by a suitable epitaxial process, for example, a selective epitaxial growth (SEG) process, a chemical vapor deposition (CVD) process (e.g., vapor-phase epitaxy (VPE), a low pressure chemical vapor deposition (LPCVD), and/or ultra-high vacuum CVD (UHV-CVD)), molecular beam epitaxy (MBE), liquid phase epitaxy (LPE), or combinations thereof. The formation process of the epitaxial structures 134a, 134c may use gaseous and/or liquid precursors, which may interact with the composition of the fins 111a, 110c thereunder.

The epitaxial structures 134b, 134d may be doped or undoped in-situ during the epitaxial process. For example, the epitaxially grown Si epitaxial structure may be doped with carbon to form a Si:C epitaxial structure, phosphorous to form a Si:P epitaxial structure, or both carbon and phosphorous to form a SiCP epitaxial structure. The doping may be achieved by an ion implantation process, plasma immersion ion implantation (PIII) process, gas and/or solid source diffusion process, another suitable process, or combinations thereof. The epitaxial structures 134a, 134c may further be exposed to an annealing process, such as a rapid thermal annealing (RTA) process and/or laser annealing process. The annealing process may be used to activate the dopants. If the epitaxial structures 134a, 134c are not doped in-situ, a second implantation process (e.g., a junction implant process) is performed to dope the epitaxial structures 134a, 134c.

The epitaxial structures 134a, 134c are strained and stressed to enhance carrier mobility of the FinFET device structure and enhance the FinFET structure performance. As shown in FIG. 18A, epitaxial structures 134a, 134c are first grown vertically in the recesses 140, during which time the epitaxial structure 134a, 134b do not grow horizontally. After the recesses 140 are fully filled, the epitaxial structures 134a, 134b may grow both vertically and horizontally to form facets corresponding to crystalline planes of the substrate 1o6. In FIG. 18A, the cross sectional shape of each epitaxial structures 134a, 134c is substantially a rhombus shape as a result that silicon carbon, silicon phosphorous, or silicon carbon phosphorous is formed more efficiently along its crystal planes. However, the shape of the epitaxial structures 134a, 134c is not intended to be limiting.

Figure 19C:
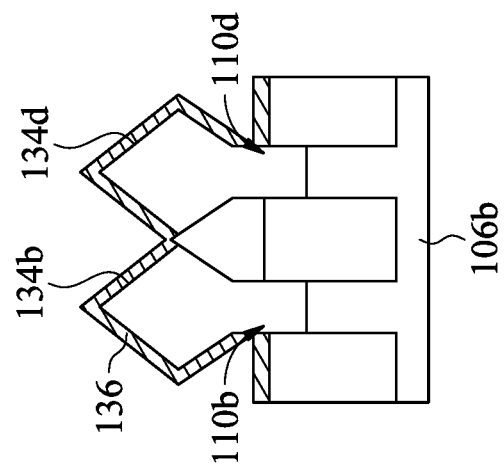
Figure 19B:
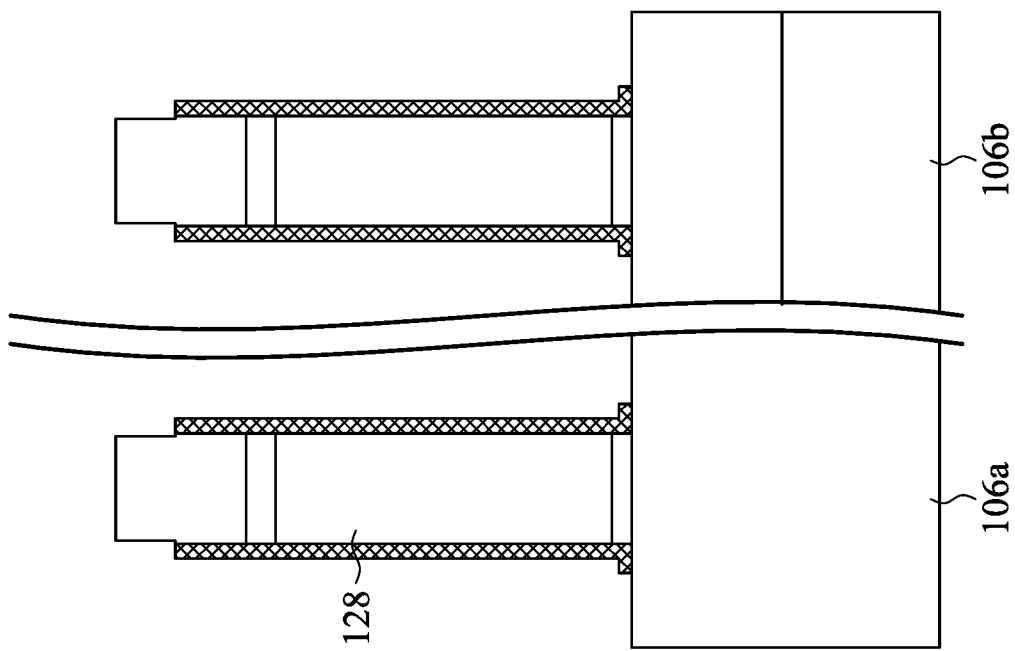
Figure 19A:
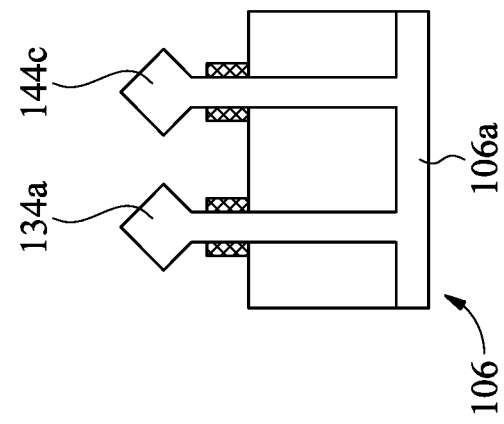

In FIGS. 19A, 19B, and 19C, the hard mask 138 and the sacrificial layer 136 are removed by an etch process. In one embodiment, the hard mask 138 and the sacrificial layer 136 may be removed by a wet etching process. For example, the hard mask 138 and the sacrificial layer 136 are removed using a wet etchant comprising $H_3PO_4$. Other suitable etchants, such as HF or the like may also be used.

Figure 20A:
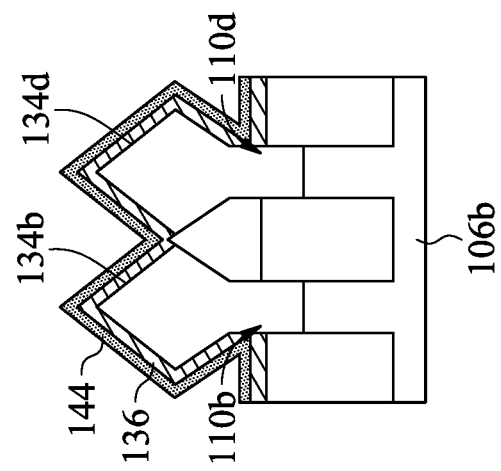
Figure 20B:
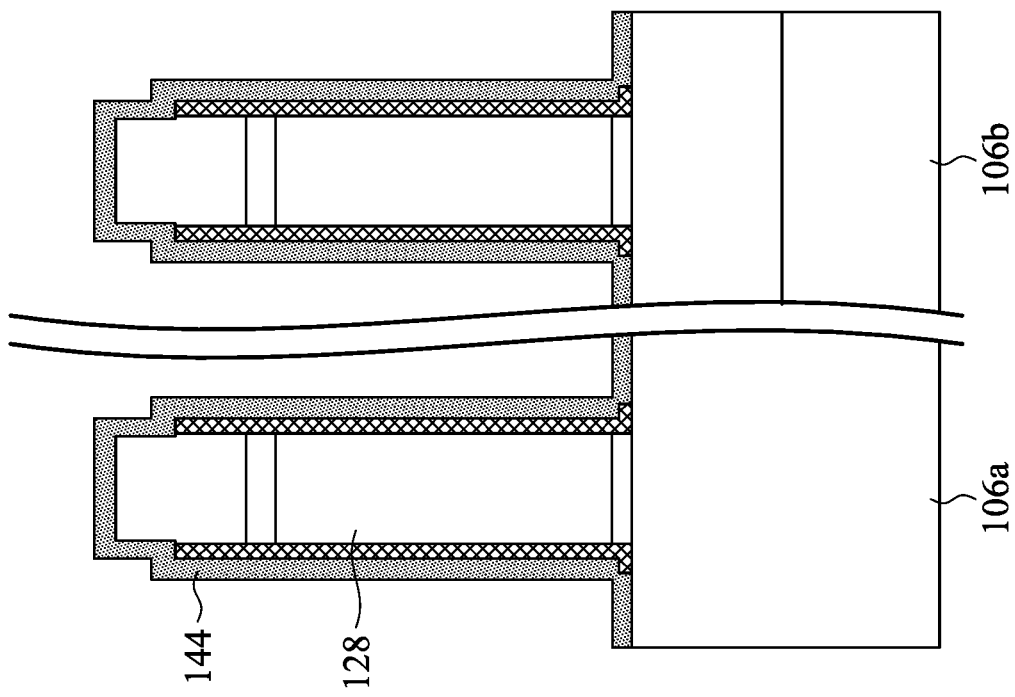
Figure 20C:
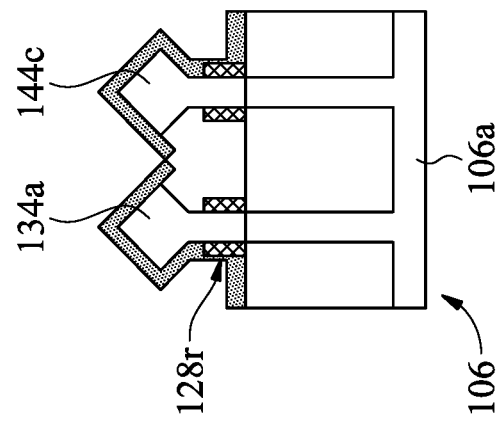

In FIGS. 20A, 20B, and 20C, a second spacer layer 144 is conformally formed over the substrate 106. The second spacer layer 144 covers the top surface and sidewalls of dummy gate stacks 120a, 120b, the top surface of isolation regions 108, and the sidewalls and the top surface of the epitaxial structures 134a, 134b, 134c, 134d. In some embodiments, the second spacer layer 144 is or includes silicon oxycarbide (SiOC), silicon oxycarbonnitride (SiOCN), or other applicable dielectric materials.

In some embodiments, the second spacer layer 144 includes one or more low-k dielectric materials having a dielectric constant (k) equal to or less than 3.9. In one example, the second spacer layer 144 may include low-k dielectric materials having a dielectric constant (k) in a range from about 3.9 to about 2.5. The second spacer layer 144 may be formed by plasma enhanced CVD, low pressure CVD, ALD, or other applicable processes. In some embodiment, the second spacer layer 144 is a porous dielectric film. The second spacer layer 144 may include pores having a median radius in a range from about 0.4 nm to about 0.43 nm. The second spacer layer 144 may have a porosity in a range between about 2.00% to about 3.50%. For example, the second spacer layer 144 may have a porosity of about 3.27%.

In some embodiments, the thickness of the second spacer layer 144 is in a range from about 20 angstroms to about 40 angstroms. In some embodiments, the thickness of the second spacer layer 144 is in a range from about 40% to about 70% of a designed thickness of gate spacers. In one embodiment, the second spacer layer 144 has a conformity in a range between about 90% to about 100%.

Figure 21C:
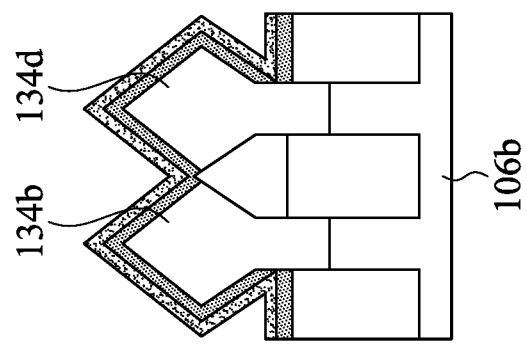
Figure 21B:
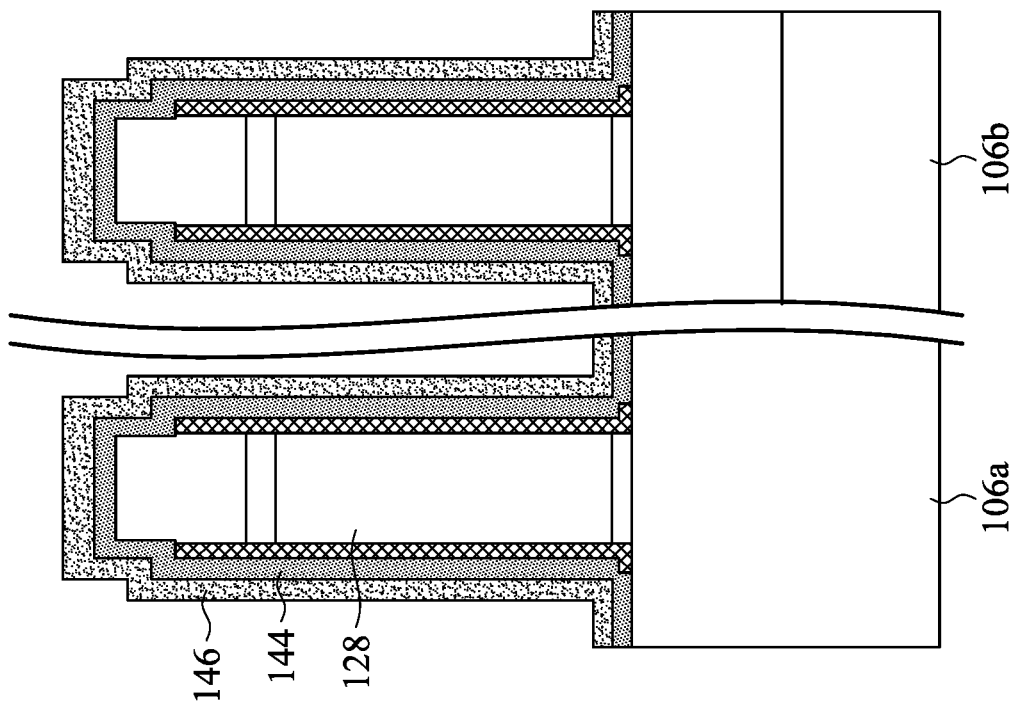
Figure 21A:
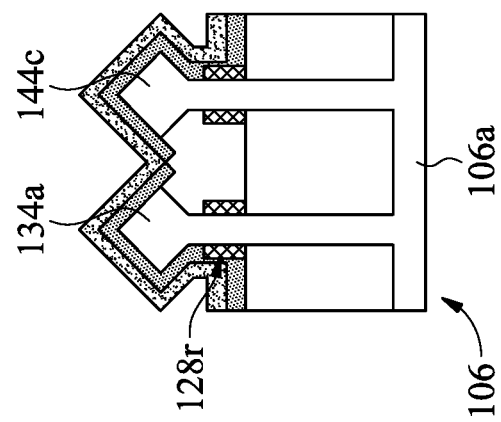

In FIGS. 21A, 21B, and 21C, a contact etch stop layer (CESL) 146 is conformally formed over substrate 106 to cover the second spacer layer 144. In some embodiments, the contact etch stop layer 146 is made of silicon nitride, silicon oxynitride, and/or other applicable materials. The contact etch stop layer 146 may be formed by plasma enhanced CVD, low pressure CVD, ALD, or other applicable processes.

Figure 22C:
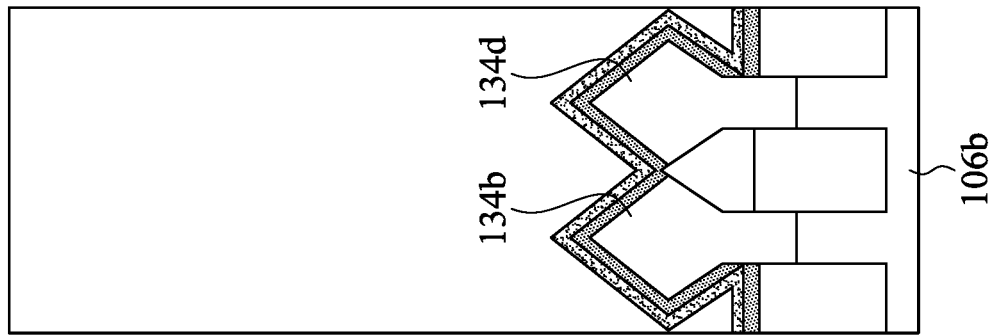
Figure 22B:
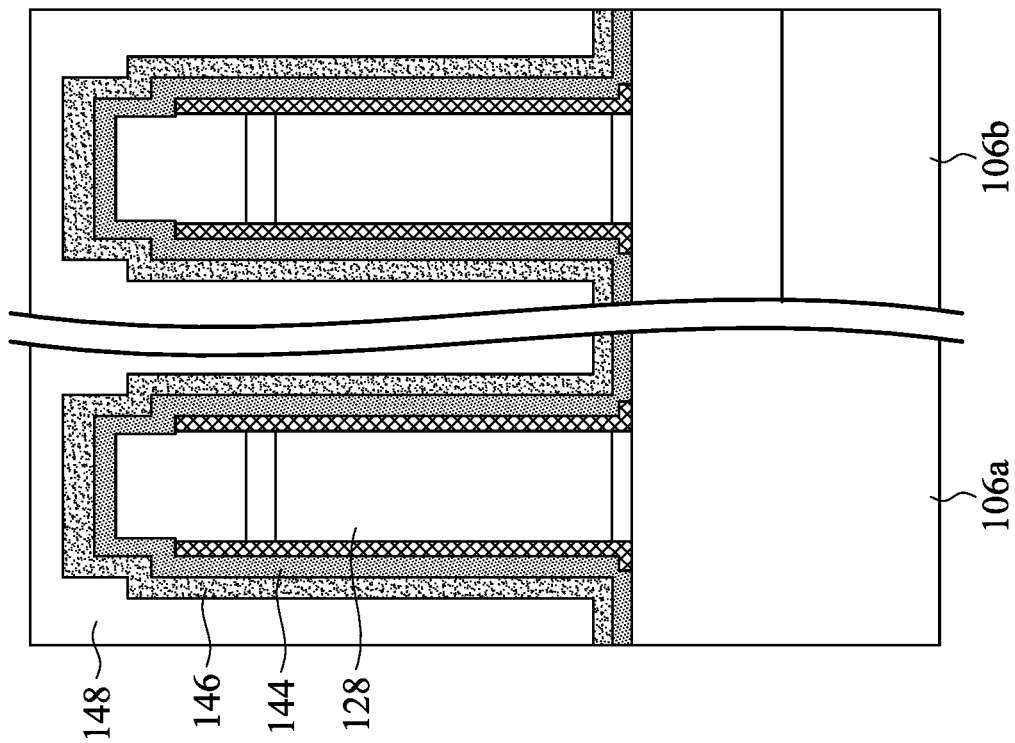
Figure 22A:
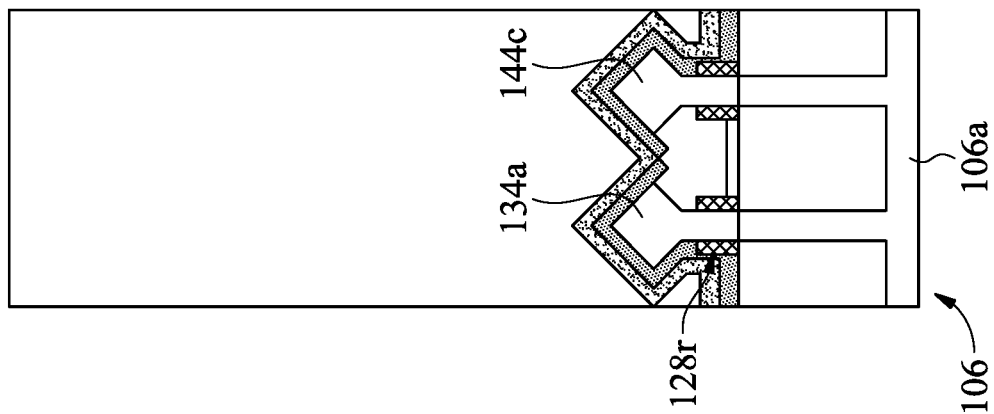

In FIGS. 22A, 22B, and 22C, an inter-layer dielectric (ILD) layer 148 is formed over the contact etch stop layer 146 over substrate 106 in accordance with some embodiments. The inter-layer dielectric layer 148 may include one or multiple layer including dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric layer 148 may be formed by chemical vapor deposition (CVD), physical vapor deposition, (PVD), atomic layer deposition (ALD), spin-on coating, or other applicable processes.

Figure 23C:
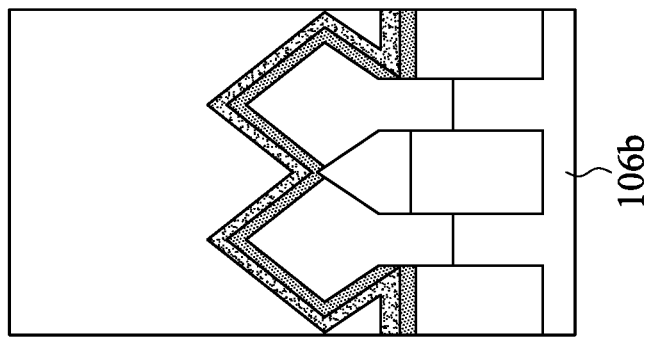
Figure 23B:
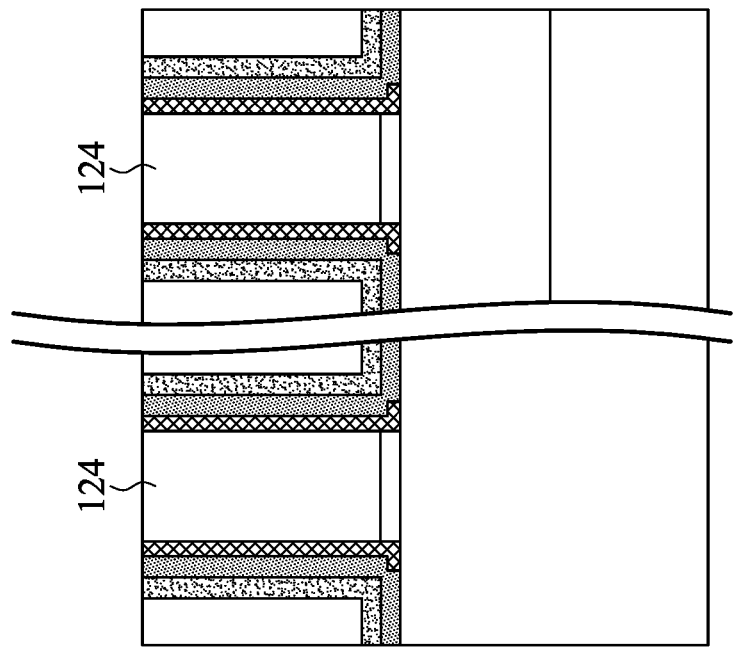
Figure 23A:
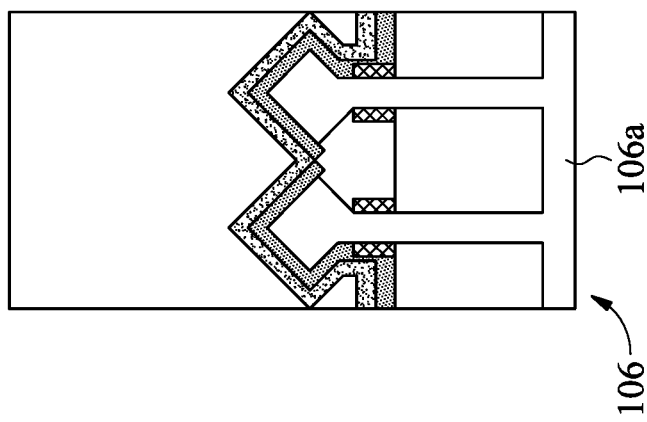

After forming the inter-layer dielectric layer 148, a planarization process is performed to expose the top surface of the dummy gates 124 as shown in FIGS. 23A, 23B, and 23C. In some embodiments, the planarization process may be a chemical mechanical polishing (CMP) process.

Figure 24C:
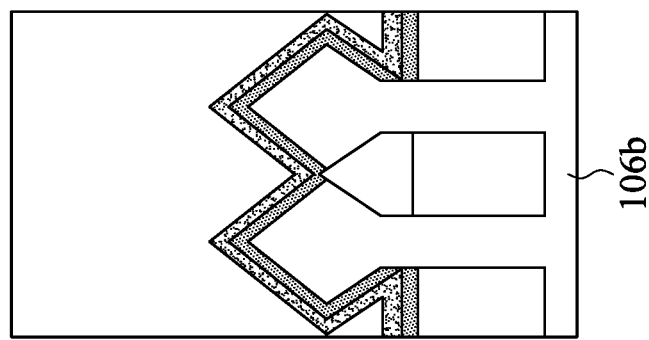
Figure 24B:
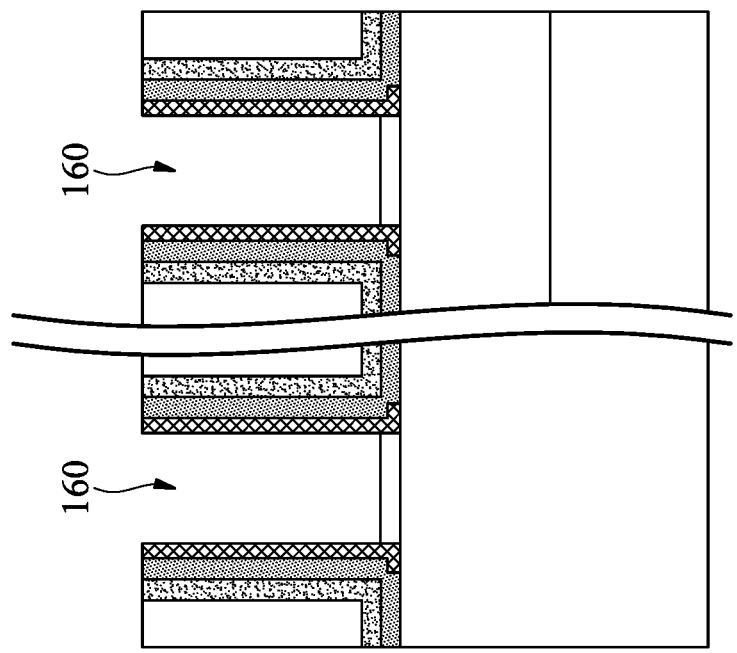
Figure 24A:
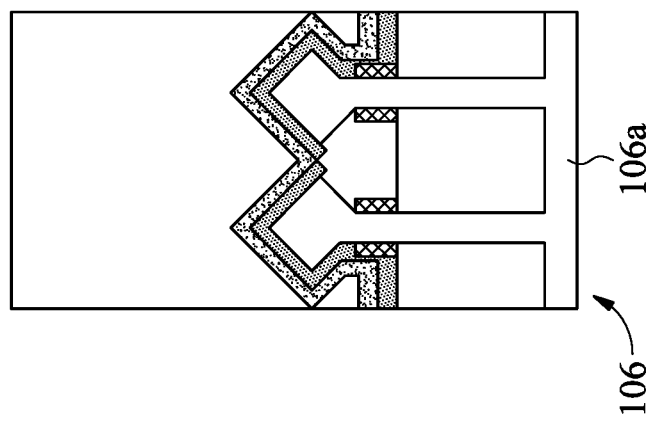

After the planarization process, the dummy gates 124 are removed to form trenches 160, as shown in FIGS. 24A, 24B, and 24C. The dummy gates 124 may be removed by performing a first etching process and performing a second etching process after the first etching process.

In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or a combination thereof. In some embodiments, the dry etching process is performed at a temperature in a range from about 20° C. to about 80° C. In some embodiments, the dry etching process is performed at a pressure in a range from about 1 mtorr to about 100 mtorr. In some embodiments, the dry etching process is performed at a power in a range from about 50 W to about 1500 W. The wet etching process may include using HF and $NH_4OH$. In some embodiments, wet etching process is performed at a temperature in a range from about 30° C. to about 200° C. In some embodiments, wet etching process is performed for a time in a range from about 20 seconds to about 400 seconds.

Figure 25C:
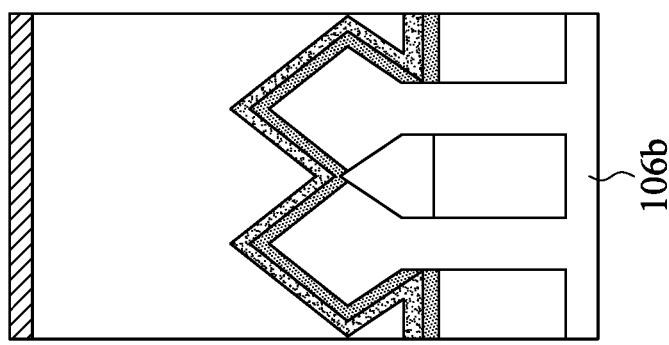
Figure 25B:
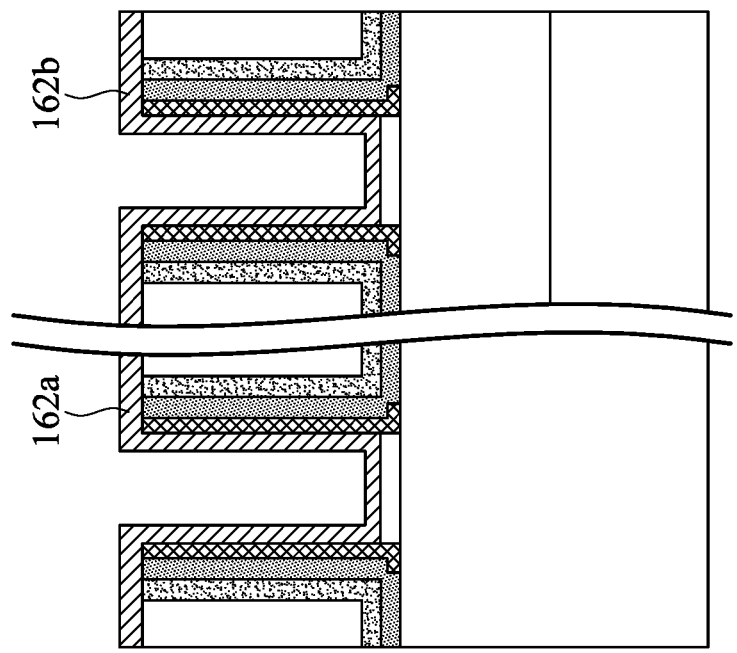
Figure 25A:
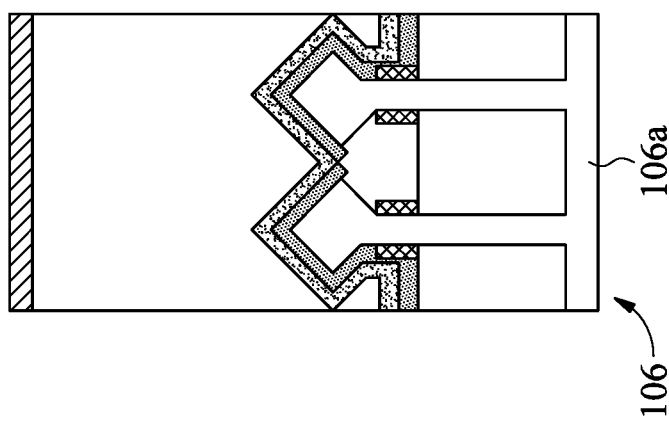

After the dummy gates 124 are removed, replacement gate stacks 150a, 150b are formed in the trenches 160. As shown in FIGS. 25A, 25B, and 25C, a high-k dielectric layer 162a, 162b for the N-type FinFET structure 102 and P-type FinFET structure 104 is deposited. In some embodiments, the high-k dielectric layer 162a, 162b is or includes metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, the high-k dielectric layer 162a, 162b may be formed from different materials for the N-type FinFET structure 102 and P-type FinFET structure 104. Patterned masks may be used to form the high-k dielectric layer 162a, 162b separately.

Figure 26C:
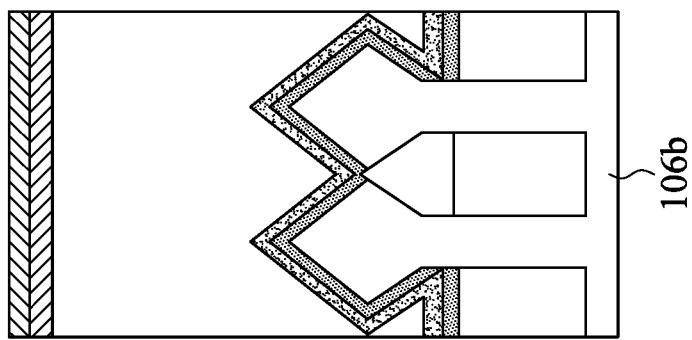
Figure 26B:
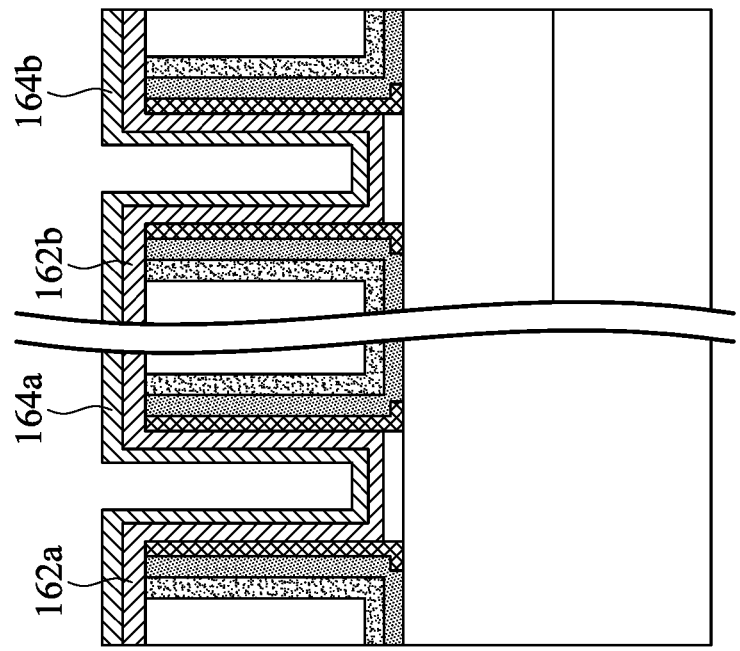
Figure 26A:
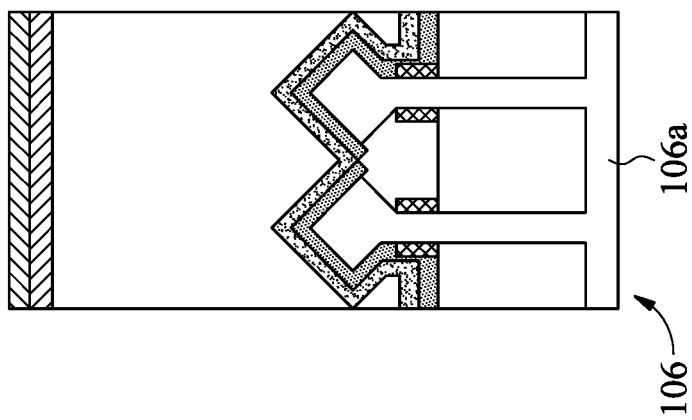

As shown in FIGS. 26A, 26B, and 26C, work function tuning layers 164a, 164b are formed over high-k dielectric layer 162a, 162b. The work function tuning layer 164a, 164b may be implemented to tune a work function. In some embodiments, the work function tuning layers 164a, 164b may be formed from different materials for the N-type FinFET structure 102 and P-type FinFET structure 104. Patterned masks may be used to form the work function tuning layers 164a, 164b separately.

The work function tuning layer 164a may include N-type work function materials for the N-type FinFET structure 102. Examples of N-type work function materials include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AC)), aluminides, and/or other applicable materials.

The work function tuning layer 164b may include P-type work function materials for the P-type FinFET structure 104. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

Figure 27C:
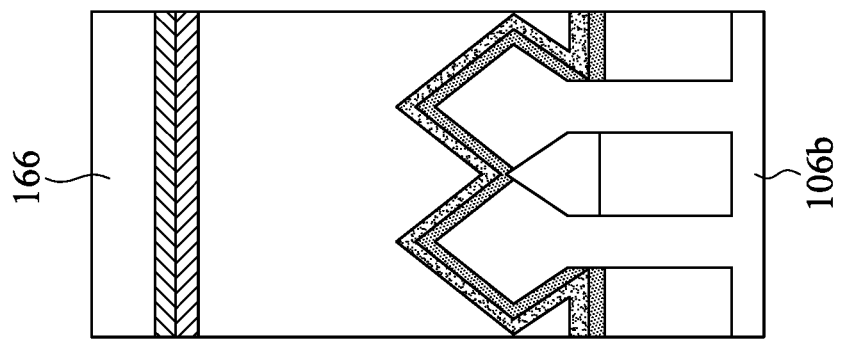
Figure 27B:
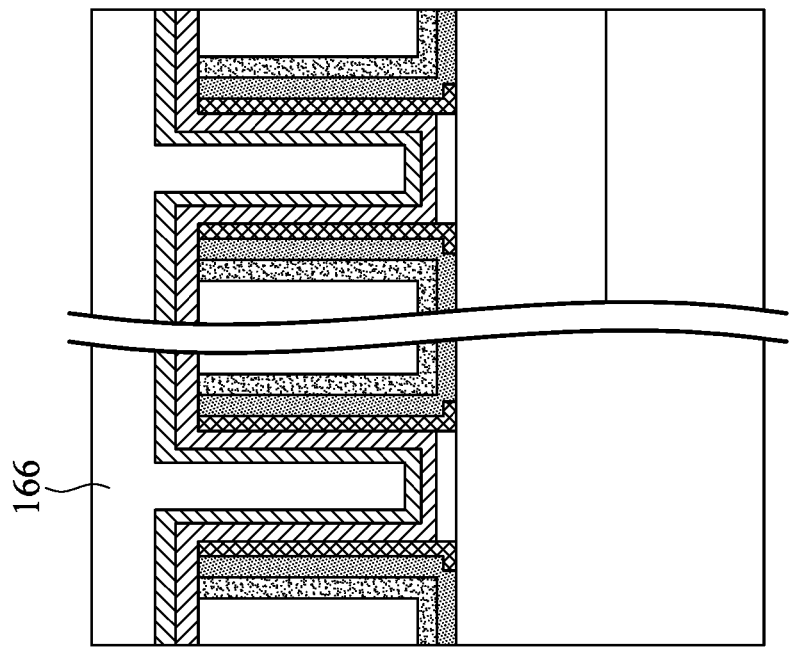
Figure 27A:
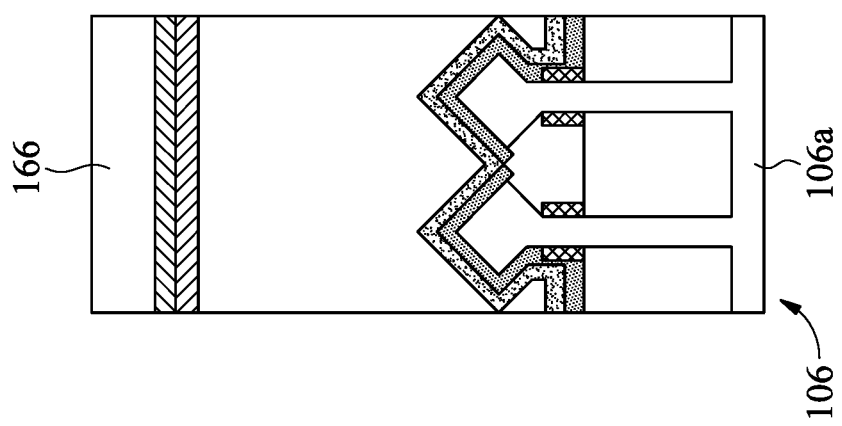

In FIGS. 27A, 27B, and 27C, a metal gate electrode layer 166 is formed over work function tuning layer 164a, 164b. In some embodiments, metal gate electrode layer 166 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The metal gate electrode layer 166 may be formed by CVD, ALD, PVD, metal-organic chemical vapor deposition (MOCVD), plating, and/or other suitable processes.

Figure 28C:
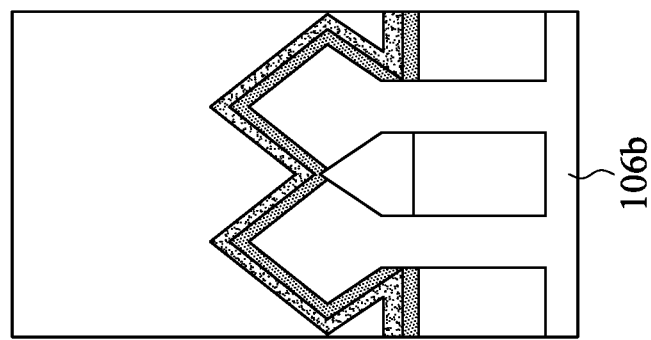
Figure 28B:
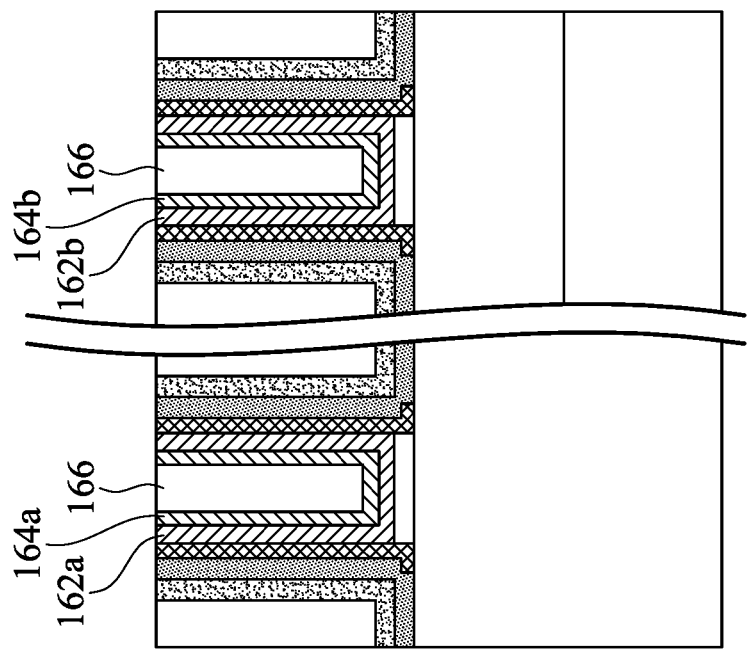
Figure 28A:
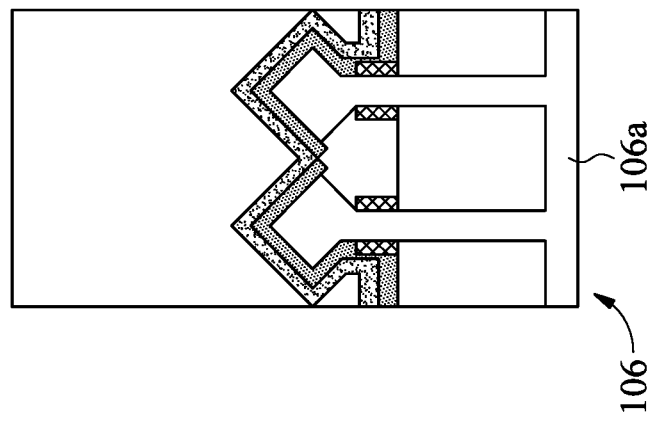

In FIGS. 28A, 28B, and 28C, a planarization process, such as a CMP process, is performed after formation of the metal gate electrode layer 166 until the first spacer layer 128 and the second spacer layer 144 are exposed. As shown in FIG. 28B, the first spacer layer 128 covers sidewalls of the high-k dielectric layer 162a, 162b of the gate stacks 150a, 150b and a portion of top surface, sidewalls of the fins 111a, 110c, 110b, 110d at both ends of the channel region. The second spacer layer 144 covers the first spacer layer 128 at the sidewalls of the gate stacks 150a, 150b, top surfaces and sidewalls of the source/drain regions 134a, 134b, 134c, 134d, and top surfaces of the isolation regions 108.

Embodiments of the present disclosure provide a method of forming gate spacers by depositing a first spacer layer and a sacrificial layer prior to fin recessing, and depositing a second spacer layer after epitaxial growth. The methods may be used to form epitaxial source/drain regions for P-type FinFET structures or N-type FinFET structures. The method may prevent thickness loss of the gate spacers, may avoid sidewall loss in dummy gates, prevent corner damage in the gate structure, avoid mushroom defects, and prevent loss of the isolation regions.

One embodiment of the present disclosure provides method including forming a first dielectric layer over a fin structure and a dummy gate stack, the dummy gate stack being over the fin structure; conformally depositing a sacrificial layer over the first dielectric layer; performing an anisotropic etch process to expose portions of the fin structure while sidewalls of the dummy gate stack remain covered by the sacrificial layer and the first dielectric layer; growing source/drain regions from the exposed portions of the fin structure; removing the sacrificial layer to expose the first dielectric layer; and depositing a second dielectric layer on the first dielectric layer.

Another embodiment of the present disclosure provides a structure including a fin structure having source/drain regions on a substrate; a metal gate structure between the source/drain regions on the fin structure, wherein the metal gate structure includes a conformal high-k dielectric layer over the fin structure; and a gate electrode over the conformal high-k dielectric layer; a first gate spacer along a sidewall of the metal gate structure; and a second gate spacer along the first gate spacer and over the source/drain regions of the fin structure, wherein the first gate spacer is disposed between the metal gate structure and the second gate spacer.

Yet another embodiment of the present disclosure provides a method, including forming a dummy gate stack over a fin structure, forming a first spacer layer over the fin structure and the dummy gate stack, depositing a sacrificial layer over the first spacer layer, recessing the fin structure on both sides of the dummy gate stack, growing source/drain regions from the recessed fin structure, removing the sacrificial layer to expose the first spacer layer; and depositing a second spacer layer over the first spacer layer, the source/drain region, and the dummy gate stack; depositing a contact etch stop layer over the second spacer layer; removing the dummy gate stack to form a recess between remaining portions of the first spacer layer; and forming a metal gate stack in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first dielectric layer over a fin structure and a dummy gate stack, the dummy gate stack being over the fin structure;
    depositing a sacrificial layer over the first dielectric layer;
    performing an etch process to expose portions of the fin structure while sidewalls of the dummy gate stack remain covered by the sacrificial layer and the first dielectric layer;
    growing source/drain regions from the exposed portions of the fin structure;
    removing the sacrificial layer to expose the first dielectric layer adjacent the dummy gate stack;
    after removing the sacrificial layer, forming a third dielectric layer on the first dielectric layer, wherein the third dielectric layer directly contacts the first dielectric layer;
    removing the third dielectric layer; and
    after removing the third dielectric layer, depositing a second dielectric layer on the first dielectric layer.

2. The method of claim 1, wherein the second dielectric layer comprises a low-k dielectric.

3. The method of claim 2, wherein the second dielectric layer has a thickness in a range from 20 angstroms to 40 angstroms.

4. The method of claim 2, wherein the second dielectric layer includes pores having a median radius in a range from 0.4 nm to 0.43 nm.

5. The method of claim 2, wherein the second dielectric layer is a porous film having a porosity in a range from 2.00% to 3.50%.

6. The method of claim 1, wherein depositing a sacrificial layer comprises using a conformal deposition process.

7. The method of claim 1, wherein removing the sacrificial layer is performed after growing the source/drain regions.

8. The method of claim 1, wherein a portion of the first dielectric layer remains adjacent the source/drain regions.

9. A method of forming a semiconductor device, the method comprising:
    forming a first dummy gate over a first fin structure and a second dummy gate over a second fin structure;
    forming a first spacer layer over the first dummy gate, the first fin structure, the second dummy gate, and the second fin structure;
    forming a first sacrificial layer over the first spacer layer;
    removing portions of the first sacrificial layer and the first spacer layer to expose the first fin structure;
    forming first source/drain regions on the first fin structure;
    removing the first sacrificial layer;
    forming a second sacrificial layer over the first spacer layer, the second dummy gate, and the second fin structure;
    removing portions of the second sacrificial layer and the first spacer layer to expose the second fin structure, wherein, after removing portions of the second sacrificial layer and the first spacer layer to expose the second fin structure, portions of the first spacer layer remain along sidewalls of the second fin structure to form spacer portions; and
    forming second source/drain regions on the second fin structure.

10. The method of claim 9, further comprising:
    removing the second sacrificial layer; and
    forming a second spacer layer over the first spacer layer, wherein the second spacer layer has a lower dielectric constant than the first sacrificial layer and the second sacrificial layer.

11. The method of claim 10, wherein the second spacer layer is a low-k dielectric layer.

12. The method of claim 10, further comprising forming an etch stop layer over the second spacer layer.

13. The method of claim 12, wherein forming the second spacer layer comprises forming the second spacer layer over the first source/drain regions, wherein the second spacer layer is interposed between the etch stop layer and the first source/drain regions.

14. The method of claim 13, wherein forming the second spacer layer comprises forming the second spacer layer over the second source/drain regions, wherein the second spacer layer is interposed between the etch stop layer and the second source/drain regions.

15. The method of claim 14, wherein the second spacer layer is porous.

16. A semiconductor device comprising:
    a first transistor on a substrate, the first transistor comprising:
        a first epitaxial source/drain region over a first fin;
        a first gate structure adjacent the first epitaxial source/drain region, wherein the first gate structure includes:
            a first high-k dielectric layer over the first fin; and
            a first gate electrode over the first high-k dielectric layer;
        a first gate spacer along a sidewall of the first gate structure; and
        a second gate spacer along a sidewall of the first gate spacer and over the first epitaxial source/drain region, wherein the first gate spacer is disposed between the first gate structure and the second gate spacer; and
    a second transistor on the substrate, the second transistor comprising:
        a second epitaxial source/drain region over a second fin, the second epitaxial source/drain region having a smaller cross-sectional area than the first epitaxial source/drain region;
        a second gate structure adjacent the second epitaxial source/drain region, wherein the second gate structure includes:
            a second high-k dielectric layer over the second fin; and
            a second gate electrode over the second high-k dielectric layer;
        a third gate spacer along a sidewall of the second gate structure;
        a fourth gate spacer along a sidewall of the second gate spacer and over the second epitaxial source/drain region, wherein the third gate spacer is disposed between the second gate structure and the fourth gate spacer; and spacer portions along opposing sidewalls of the second epitaxial source/drain region, wherein the spacer portions, the first gate spacer, and the third gate spacer are formed of a same material, wherein the first epitaxial source/drain region is free of the spacer portions.

17. The semiconductor device of claim 16, wherein a thickness of the second gate spacer is 40% to 70% of a total thickness of the first gate spacer and the second gate spacer.

18. The semiconductor device of claim 16, wherein the second gate spacer and the fourth gate spacer are formed of a same low-k dielectric layer.

19. The semiconductor device of claim 18, further comprising:

a first dielectric layer over the first epitaxial source/drain region; and a second dielectric layer over the second epitaxial source/drain region, wherein the first dielectric layer, the second dielectric layer, the second gate spacer, and the fourth gate spacer are formed of the same low-k dielectric layer.

20. The semiconductor device of claim 19, further comprising an etch stop layer over the second gate spacer, the fourth gate spacer, the first dielectric layer, and the second dielectric layer.

\* \* \* \* \*